(12) United States Patent
Lee et al.

(10) Patent No.: US 10,411,119 B2
(45) Date of Patent: Sep. 10, 2019

(54) METHOD OF FABRICATING SEMICONDUCTOR DEVICE

(71) Applicants: Jae-Hwan Lee, Seoul (KR); Sangsu Kim, Yongin-si (KR); Sanghyuk Hong, Yongin-si (KR); Seung Mo Ha, Seoul (KR)

(72) Inventors: Jae-Hwan Lee, Seoul (KR); Sangsu Kim, Yongin-si (KR); Sanghyuk Hong, Yongin-si (KR); Seung Mo Ha, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 173 days.

(21) Appl. No.: 15/093,145

(22) Filed: Apr. 7, 2016

(65) Prior Publication Data

US 2016/0329414 A1 Nov. 10, 2016

(30) Foreign Application Priority Data

May 6, 2015 (KR) .................. 10-2015-0063252

(51) Int. Cl.
*H01L 29/66* (2006.01)
*H01L 21/02* (2006.01)
*H01L 21/311* (2006.01)
*H01L 29/40* (2006.01)
*H01L 29/08* (2006.01)

(52) U.S. Cl.
CPC .... *H01L 29/66795* (2013.01); *H01L 29/0847* (2013.01)

(58) Field of Classification Search
CPC .................. H01L 29/66795; H01L 29/0847
See application file for complete search history.

(56) References Cited

U.S. PATENT DOCUMENTS

| | | |
|---|---|---|
| 6,977,218 B2 | 12/2005 | Yu et al. |
| 7,678,641 B2 | 3/2010 | Mori et al. |
| 7,678,699 B2 | 3/2010 | Hohage et al. |
| 7,820,500 B2 | 10/2010 | Ning |

(Continued)

FOREIGN PATENT DOCUMENTS

| | | |
|---|---|---|
| JP | 2015-065350 A | 4/2015 |
| KR | 10-0761812 B1 | 9/2007 |

(Continued)

*Primary Examiner* — Seahvosh Nikmanesh
(74) *Attorney, Agent, or Firm* — Harness, Dickey & Pierce, P.L.C.

(57) ABSTRACT

A method of fabricating a semiconductor device includes forming an active pattern protruding from a substrate, forming a liner layer on the active pattern, forming a sacrificial gate pattern on the liner layer and crossing the active pattern, forming source/drain regions on the active pattern and at both sides of the sacrificial gate pattern, forming an interlayer insulating layer to cover the source/drain regions, forming capping insulating patterns on the interlayer insulating layer to expose the sacrificial gate pattern, and removing the sacrificial gate pattern and the liner layer by an etching process using the capping insulating patterns as an etch mask to form a gap region exposing the active pattern. The active pattern includes a material having a lattice constant greater than a lattice constant of the substrate, and the capping insulating patterns include a material having an etch selectivity with respect to the liner layer.

20 Claims, 21 Drawing Sheets

(56) References Cited

U.S. PATENT DOCUMENTS

| | | |
|---|---|---|
| 8,349,674 B2 | 1/2013 | Ponoth et al. |
| 8,404,534 B2 | 3/2013 | Wang |
| 8,772,165 B2 | 7/2014 | Kim et al. |
| 8,846,491 B1 | 9/2014 | Pham et al. |
| 8,859,377 B2 | 10/2014 | Nandakumar et al. |
| 8,895,434 B2 | 11/2014 | Ando et al. |
| 8,956,931 B2 | 2/2015 | Kuo et al. |
| 2002/0079507 A1 | 6/2002 | Shim et al. |
| 2005/0014360 A1 | 1/2005 | Yu et al. |
| 2006/0263960 A1 | 11/2006 | Yang |
| 2006/0278952 A1 | 12/2006 | Mori et al. |
| 2007/0096201 A1 | 5/2007 | Ning |
| 2007/0123044 A1 | 5/2007 | Hohage et al. |
| 2007/0196992 A1 | 8/2007 | Xiang et al. |
| 2009/0004805 A1 | 1/2009 | Nandakumar et al. |
| 2012/0205746 A1 | 8/2012 | Wang |
| 2012/0248508 A1 | 10/2012 | Ponoth et al. |
| 2013/0015532 A1 | 1/2013 | Kim et al. |
| 2013/0189841 A1 | 7/2013 | Balseanu et al. |
| 2014/0061736 A1 | 3/2014 | Hwang et al. |
| 2014/0070328 A1 | 3/2014 | Goto et al. |
| 2014/0131809 A1 | 5/2014 | Ando et al. |
| 2014/0231924 A1 | 8/2014 | Kuo et al. |
| 2015/0187946 A1 | 7/2015 | Park et al. |

FOREIGN PATENT DOCUMENTS

| | | |
|---|---|---|
| KR | 2013-0009585 A | 1/2013 |
| KR | 2013-0135304 A | 12/2013 |
| KR | 2014-0032219 A | 3/2014 |
| KR | 2014-0114052 A | 9/2014 |
| KR | 2015-0077543 A | 7/2015 |

METHOD OF FABRICATING SEMICONDUCTOR DEVICE

CROSS-REFERENCE TO RELATED APPLICATIONS

This U.S. non-provisional patent application claims priority under 35 U.S.C. § 119 to Korean Patent Application No. 10-2015-0063252, filed on May 6, 2015, in the Korean Intellectual Property Office, the entire contents of which are hereby incorporated by reference.

BACKGROUND

1. Field

Some example embodiments of the inventive concepts relate to a method of fabricating a semiconductor device and/or a method of fabricating a semiconductor device including fin field effect transistors.

2. Description of the Related Art

A semiconductor device may include integrated circuits (ICs) consisting of metal-oxide-semiconductor field-effect transistors (MOS-FETs). As a reduction in size and design rule of the semiconductor device is accelerated, the MOS-FETs are being scaled down increasingly. The reduction in size of the MOS-FET may lead to deterioration in operational properties of the semiconductor device. A variety of studies are conducted to overcome technical limitations associated with the scale-down of the semiconductor device and provide higher performance semiconductor devices.

SUMMARY

Some example embodiments of the inventive concepts provide a method of fabricating a semiconductor device with improved electric characteristics.

Other example embodiments of the inventive concepts provide a method capable of increasing a process margin in a process of forming a gate electrode of a semiconductor device.

According to an example embodiment of the inventive concepts, a method of fabricating a semiconductor device includes forming an active pattern protruding from a substrate, forming a liner layer on the active pattern, forming a sacrificial gate pattern on the liner layer and crossing the active pattern, forming source/drain regions on the active pattern and at both sides of the sacrificial gate pattern, forming an interlayer insulating layer covering the source/drain regions, the interlayer insulating layer having a top surface lower than a top surface of the sacrificial gate pattern, forming capping insulating patterns on the interlayer insulating layer to expose the sacrificial gate pattern, and removing the sacrificial gate pattern and the liner layer by an etching process using the capping insulating patterns as an etch mask to form a gap region exposing the active pattern. The active pattern may include a material having a lattice constant greater than a lattice constant of the substrate, and the capping insulating patterns may include a material having an etch selectivity with respect to the liner layer.

In an example embodiment, forming the capping insulating patterns may include forming at least one capping insulating layer to cover the top surfaces of the interlayer insulating layer and the sacrificial gate pattern, and patterning the capping insulating layer to expose the sacrificial gate pattern.

In an example embodiment, patterning the capping insulating layer may include forming protection insulating patterns on the capping insulating layer to expose a portion of the capping insulating layer and removing the portion of the capping insulating layer exposed by the protection insulating patterns by an etch-back process. The portion of the capping insulating layer may overlap the sacrificial gate pattern in a plan view, and the protection insulating patterns may include a material having an etch selectivity with respect to the capping insulating layer.

In an example embodiment, forming the at least one capping insulating layer may include sequentially forming a first capping insulating layer and a second capping insulating layer, and at least one of the first and second capping insulating layers may include a material having an etch selectivity with respect to the liner layer.

In an example embodiment, one of the first and second capping insulating layers may include a same material as the liner layer, and the other of the first and second capping insulating layers may include a material having an etch selectivity with respect to the liner layer.

In an example embodiment, the liner layer may include at least one of silicon nitride (SiN), silicon carbonitride (SiCN), silicon boron nitride (SiBN), and silicon carbon boron nitride (SiCBN), and the capping insulating layer may include silicon oxycarbonitride (SiOCN).

In an example embodiment, the method may further include forming an etch stop pattern between the active pattern and the sacrificial gate pattern. The etch stop pattern may include a material having an etch selectivity with respect to the liner layer and the capping insulating layer.

In an example embodiment, the method may further include forming a buffer pattern between the substrate and the active pattern. The buffer pattern may include a material having a lattice constant larger than the lattice constant of the substrate and different from the lattice constant of the active pattern.

In an example embodiment, the buffer pattern may include a protrusion protruding from a top surface of the buffer pattern, and the active pattern may be on a top surface of the protrusion.

In an example embodiment, forming the active pattern may include forming a buffer layer on the substrate, forming an active layer on the buffer layer, and patterning the active layer to form trenches defining the active pattern.

In an example embodiment, patterning the active layer may include etching an upper portion of the buffer layer to form the buffer pattern, and the protrusion may be defined by the trenches.

In an example embodiment, the active pattern may include a first region below the sacrificial gate pattern and second regions at both sides of the sacrificial gate pattern. Forming the source/drain regions may include partially recessing the second regions to form recess regions in the active pattern and performing a selective epitaxial process using the active pattern exposed by the recess regions as a seed layer to form the source/drain regions.

In an example embodiment, the method may further include performing one of a thermal treatment process and a plasma treatment process on the active pattern exposed by the recess regions after partially recessing the second regions.

In an example embodiment, the one of the thermal treatment process and the plasma treatment process may form a barrier layer between the source/drain regions and the active pattern.

In an example embodiment, a material of the barrier layer may include a same element as the material of the active pattern.

In an example embodiment, the method may further include forming a gate spacer layer to cover the sacrificial gate pattern before partially recessing the second regions. Partially recessing the second regions may remove a portion of the gate spacer layer to form gate spacers on sidewalls of the sacrificial gate pattern.

In an example embodiment, removing the sacrificial gate pattern and the liner layer may remove a portion of the liner layer exposed by the gap region to form liner patterns between the active pattern and the gate spacers.

In an example embodiment, the method may further include forming device isolation patterns on the substrate to expose upper portions of the active patterns. The liner layer may be formed to cover top surfaces of the device isolation patterns and the upper portions of the active patterns.

In an example embodiment, partially recessing the second regions may remove a portion of the liner layer exposed by the sacrificial gate pattern.

In an example embodiment, the active pattern may include a first region below the sacrificial gate pattern and second regions at both sides of the sacrificial gate pattern. A top surface of the first region may be coplanar with a top surface of the second regions, and forming the source/drain regions may include performing a selective epitaxial process using the second regions as a seed layer to form a cladding layer covering the top surface and upper side surfaces of each of the second regions.

In an example embodiment, the method may further include performing one of a thermal treatment process and a plasma treatment process on the second regions to form a barrier layer between the second regions and the cladding layer.

In an example embodiment, a material of the barrier layer may include a same element as the material of the active pattern.

In an example embodiment, the cladding layer may include a first sidewall inclined at a negative angle with respect to a top surface of the substrate, the first sidewall having a first end portion, a second sidewall inclined at a positive angle with respect to the top surface of the substrate, the second sidewall having a second end portion, and a third sidewall having third and fourth end portions adjacent to the substrate, the third end portion being connected to the first end portion, and the fourth end portion being connected to the second end portion.

In an example embodiment, the third sidewall may be perpendicular to the top surface of the substrate.

In an example embodiment, the method may further include forming a gate electrode in the gap region. The gate electrode may have a top surface lower than the top surface of the interlayer insulating layer.

In an example embodiment, the active pattern may include silicon germanium.

According to another example embodiments of the inventive concepts, a method of fabricating a semiconductor device may include forming an active fin protruding between device isolation patterns on a substrate, forming a liner layer to cover top and side surfaces of the active fin, forming a sacrificial gate pattern on the liner layer to cross the active fin, forming source/drain regions on the active fin and at both sides of the sacrificial gate pattern, forming an interlayer insulating layer to cover the source/drain regions and having a top surface lower than a top surface of the sacrificial gate pattern, forming capping insulating patterns on the interlayer insulating layer to expose the sacrificial gate pattern, and replacing the sacrificial gate pattern with a gate electrode. The active fin may include a material having a lattice constant greater than a lattice constant of the substrate, and the capping insulating patterns may include a material having an etch selectivity with respect to the liner layer.

In another example embodiment, the active fin may include a first region below the sacrificial gate pattern and second regions at both sides of the sacrificial gate pattern, and the liner layer may be formed to cover the first and second regions. Forming the source/drain regions may include removing the liner layer from the second regions, and forming an epitaxial layer on the second regions.

In another example embodiment, the method may further include performing one of a thermal treatment process and a plasma treatment process on the exposed second regions from which the liner layer is removed.

In another example embodiment, the one of the thermal treatment process and the plasma treatment process may be performed before forming the epitaxial layer or simultaneously with forming the epitaxial layer.

In another example embodiment, the one of the thermal treatment process and the plasma treatment process may form a barrier layer between the epitaxial layer and the active fin.

In another example embodiment, a material of the barrier layer may include a same element as the material of the active fin.

In another example embodiment, the element included in the material of the active fin and the barrier layer may be germanium.

In another example embodiment, forming the source/drain regions may further include recessing the second regions before forming the epitaxial layer.

In another example embodiment, forming the capping insulating patterns may include forming at least one capping insulating layer to cover the top surfaces of the interlayer insulating layer and the sacrificial gate pattern, forming protection insulating patterns on the capping insulating layer to expose a portion of the capping insulating layer, and removing the portion of the capping insulating layer exposed by the protection insulating patterns by an etch-back process. The portion of the capping insulating layer may overlap the sacrificial gate pattern in a plan view, and the protection insulating patterns may include a material having an etch selectivity with respect to the capping insulating layer.

In another example embodiment, forming at least one capping insulating layer may include sequentially forming a first capping insulating layer and a second capping insulating layer, and at least one of the first and second capping insulating layers may include a material having an etch selectivity with respect to the liner layer.

In another example embodiment, replacing the sacrificial gate pattern may include removing the sacrificial gate pattern and the liner layer using the capping insulating patterns as an etch mask to form a gap region exposing the active fin, forming a preliminary gate electrode to fill the gap region, and recessing the preliminary gate electrode to form the gate electrode.

According to yet another example embodiment of the inventive concepts, a method includes forming an active pattern protruding from a substrate, forming a liner layer on an upper portion of the active pattern, forming a sacrificial gate pattern on the liner layer and crossing the active pattern, forming at least one capping insulating layer on a top surface of the sacrificial gate pattern, patterning the capping insulating layer to form capping insulating patterns exposing the sacrificial gate pattern, the capping insulating patterns including a nitride-based material having an etch selectivity with respect to the liner layer, and removing the sacrificial gate pattern and the liner layer using the capping insulating patterns as an etch mask to form a gap region exposing the active pattern.

In yet another example embodiment forming the at least one capping insulating layer may include sequentially forming a first capping insulating layer and a second capping insulating layer, the first capping insulating layer including a same material as the liner layer, and the second capping insulating layer including a material having an etch selectivity with respect to the liner layer.

In yet another example embodiment, the liner layer may include at least one of silicon nitride (SiN), silicon carbonitride (SiCN), silicon boron nitride (SiBN), and silicon carbon boron nitride (SiCBN), and the capping insulating layer includes silicon oxycarbonitride (SiOCN).

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
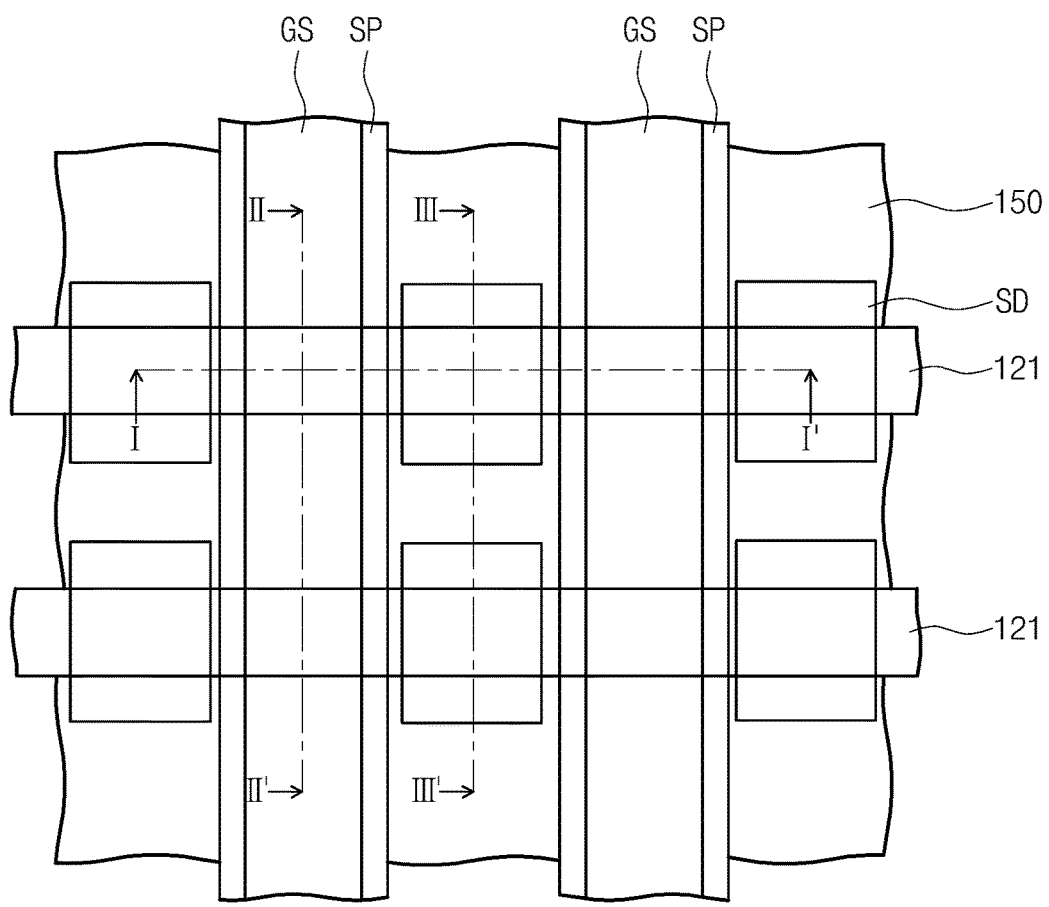
FIG. 1 is a plan view illustrating a semiconductor device according to an example embodiment of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including." if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
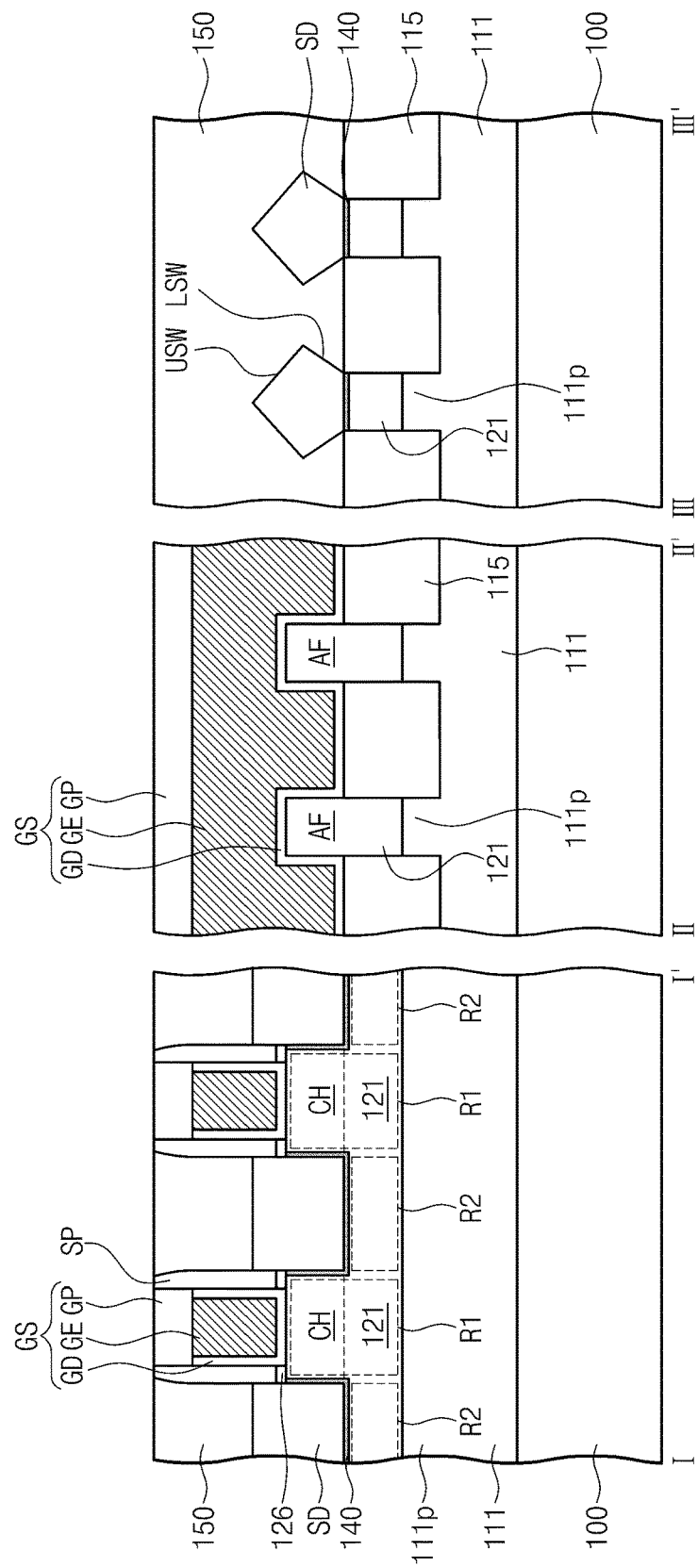
FIG. 2 is a sectional view illustrating vertical sections taken along lines I-I', II-II', and III-III' of FIG. 1.

FIG. 1 is a plan view illustrating a semiconductor device according to an example embodiment of the inventive concepts. FIG. 2 is a sectional view illustrating vertical sections taken along lines I-I', II-II', and III-III' of FIG. 1.

Referring to FIGS. 1 and 2, a buffer pattern 111 may be provided on a substrate 100, and active patterns 121 may be provided on the buffer pattern 111. The substrate 100 may be or include a semiconductor wafer, which is made of at least one of silicon, germanium, silicon germanium, or Group III-V semiconductor compounds.

The buffer pattern 111 may include a material whose lattice constant is different from that of the substrate 100. For example, the lattice constant of the buffer pattern 111 may be larger than that of the substrate 100. As an example, in the case where the substrate 100 is a silicon wafer, the buffer pattern 111 may be formed of or include a silicon-germanium layer. The buffer pattern 111 may include protrusions 111p protruding in a direction perpendicular to a top surface of the substrate 100. The protrusions 111p may be continuously extended from the buffer pattern 111, thereby constituting a single layer.

The active patterns 121 may be provided on top surfaces of the protrusions 111p. The active patterns 121 may extend in a first direction D1 and may be arranged in a second direction D2 crossing the first direction D1. The active patterns 121 may protrude from the buffer pattern 111, toward a third direction D3 perpendicular to both of the first and second directions D1 and D2. The first and second directions D1 and D2 may be selected to be parallel to the top surface of the substrate 100. Each of the protrusions 111p may extend along a bottom surface of a corresponding one of the active pattern 121 or in the first direction D1.

The buffer pattern 111 may be formed of or include a material, whose lattice structure is the same as that of the active patterns 121, but whose lattice constant is different from that of the active patterns 121. In example embodiments, the buffer pattern 111 may be formed of or include a material, whose lattice constant is smaller than that of the active patterns 121. As an example, the buffer pattern 111 may include a $Si_{1-x}Ge_x$ layer, and the active patterns 121 may include a Ge layer. As another example, the buffer pattern 111 may include a $Si_{1-z}Ge_z$ layer, and the active patterns 121 may include a $Si_{1-w}Ge_w$ layer (where z<w). As still another example, the buffer pattern 111 may include an $In_{1-z}Ga_zAs$ layer, and the active patterns 121 may include an $In_{1-w}Ga_wAs$ layer (where z>w). In these cases, the buffer pattern 111 may exert a compressive strain to the active patterns 121 (e.g., of PMOSFETs).

In other example embodiments, the buffer pattern 111 may be formed of or include a material, whose lattice constant is greater than that of the active patterns 121. As an example, the buffer pattern 111 may include a $Si_{1-x}Ge_x$ layer, and the active patterns 121 may include a $Si_{1-y}Ge_y$ layer (where x>y). As another example, the buffer pattern 111 may include an $In_{1-x}Ga_xAs$ layer, and the active patterns 121 may include $In_{1-y}Ga_yAs$ (where x<y). In these cases, the buffer pattern 111 may exert a tensile strain to the active patterns 121 (e.g., of NMOSFETs). As described above, the difference in lattice constant between the buffer pattern 111 and the active patterns 121 may make it possible to relax a strain of the buffer pattern 111 and apply a strain to the active patterns 121.

Device isolation patterns 115 may be provided on the substrate 100. The device isolation patterns 115 may expose upper portions of the active patterns 121. Hereinafter, the upper portions of the active patterns 121 exposed by the device isolation patterns 115 will be referred to as "active fins AF". The device isolation patterns 115 may be formed of or include at least one of, for example, silicon oxide, silicon nitride, or silicon oxynitride.

Gate structures GS may be provided on the substrate 100 to cross the active patterns 121. The gate structures GS may extend in the second direction D2 and may be spaced apart from each other in the first direction D1. The gate structures GS may cover partially top and side surfaces of the active patterns 121. In other words, the gate structures GS may be provided to cross the active patterns 121 and cover top and side surfaces of the active fins AF. Hereinafter, portions of the active fins AF positioned below the gate structures GS may be referred to as "channel regions CH". In other words, the channel regions CH may be portions of the active patterns 121 exposed by the device isolation pattern 115 and positioned below the gate structures GS. Gate spacers SP may be provided on sidewalls of the gate structures GS. The gate spacers SP may extend along the sidewalls of the gate structures GS or in the second direction D2. The gate spacers SP may be formed of or include at least one of, for example, silicon nitride, silicon oxynitride, or low-k dielectric materials (e.g., silicon carbonitride). In certain embodiments, the active patterns 121 may include first regions R1 positioned below the gate structures GS and second regions R2 positioned at both sides of the gate structures GS. Upper portions of the first regions R1 may correspond to the channel regions CH. In the present embodiment, the first regions R1 may have top surfaces that are positioned at a higher level than those of the second regions R2.

Each of the gate structures GS may include a gate electrode GE, a gate capping pattern GP on the gate electrode GE, and a gate dielectric pattern GD between the gate electrode GE and the gate spacers SP. In example embodiments, the gate dielectric pattern GD may be disposed between the gate electrode GE and the active patterns 121 and may be horizontally extended from the active patterns 121 to partially cover the top surfaces of the device isolation patterns 115. The gate dielectric pattern GD may extend along a bottom surface of the gate electrode GE.

The gate electrode GE may be formed of or include at least one of conductive metal nitrides (e.g., titanium nitride or tantalum nitride) or metals (e.g., aluminum or tungsten). The gate dielectric pattern GD may be formed of or include at least one high-k dielectric layer. For example, the gate dielectric pattern GD may include at least one of hafnium oxide, hafnium silicate, zirconium oxide, or zirconium silicate, but example embodiments of the inventive concepts are not limited thereto. The gate capping pattern GP may be formed of or include at least one of, for example, silicon nitride or silicon oxynitride.

Liner patterns 126 may be provided between the active patterns 121 and the gate spacers SP. The liner patterns 126 may be formed of or include a nitride-based material. For example, the liner patterns 126 may include at least one of silicon nitride (SiN), silicon carbonitride (SiCN), silicon boron nitride (SiBN), or silicon carbon boron nitride (SiCBN). The liner patterns 126 may extend along bottom surfaces of the gate spacers SP or in the second direction D2.

Source/drain regions SD may be provided at both sides of each of the gate structures GS. In other words, the source/drain regions SD may be provided on the second regions R2 of the active patterns 121. In example embodiments, each of the source/drain regions SD may be an epitaxial layer grown by an epitaxial process, in which a top surface of a corresponding one of the second regions R2 and an upper sidewall of a corresponding one of the first regions R1 are used as a seed layer. For the PMOSFETs, the source/drain regions SD may include a material capable of exerting a compressive strain to the channel regions CH. For example, in the case where the active patterns 121 includes a SiGe layer, the source/drain regions SD may include a SiGe layer having a larger lattice constant, or a higher germanium concentration, than that of the active patterns 121. For the NMOSFETs, the source/drain regions SD may include a material capable of exerting a tensile strain to the channel regions CH. For example, in the case where the active patterns 121 includes a SiGe layer, the source/drain regions SD may include a Si or SiC layer, whose lattice constant is smaller than that of the active patterns 121, or a SiGe layer, whose germanium concentration is lower than that of the active patterns 121. The source/drain regions SD may be doped to have a p- or n-conductivity type.

Each of the source/drain regions SD may have a lower sidewall LSW, which is inclined at a substantially negative angle with respect to the top surface of the substrate 100, and an upper sidewall USW, which is inclined at a substantially positive angle with respect to the top surface of the substrate 100. The lower sidewall LSW may meet the upper sidewall USW adjacent thereto to form a vertex.

A barrier layer 140 may be interposed between the source/drain regions SD and the active patterns 121. In other words, the barrier layer 140 may be interposed between the source/drain regions SD and the top surfaces of the second regions R2 and between the source/drain regions SD and the upper sidewalls of the first regions R1. The barrier layer 140 may include the same element as that contained in the active patterns 121. For example, in the case where the active patterns 121 include silicon germanium, the barrier layer 140 may include germanium. The barrier layer 140 may have a thickness ranging from about 0 nm to about 3 nm.

A lower interlayer insulating layer 150 may be provided on the substrate 100 to cover the source/drain regions SD and the gate structures GS. The lower interlayer insulating layer 150 may have a top surface coplanar with those of the gate structures GS. The lower interlayer insulating layer 150 may be formed of or include at least one of, for example, a silicon oxide layer or low-k dielectric layers. The lower interlayer insulating layer 150 may be formed to cover device isolation patterns 130 exposed by the gate structures GS.

In example embodiments, an upper interlayer insulating layer (not shown) may be provided on the lower interlayer insulating layer 150. The upper interlayer insulating layer may cover the top surfaces of the gate structures GS. The upper interlayer insulating layer may include at least one of a silicon oxide layer, a silicon nitride layer, a silicon oxynitride layer, or low-k dielectric layers. First and second contact plugs (not shown) may be formed to penetrate the upper interlayer insulating layer and the lower interlayer insulating layer 150. The first contact plugs may be electrically connected to the source/drain regions SD and the second contact plugs may be electrically connected to the gate electrode GE. Interconnection lines (not shown) may be provided on the upper interlayer insulating layer to be coupled to the first and second contact plugs. The interconnection lines may be configured to apply voltages to the source/drain regions SD and the gate electrode GE through the first and second contact plugs. The first and second contact plugs and the interconnection lines may be formed of or include at least one of conductive materials.

Figure 3:
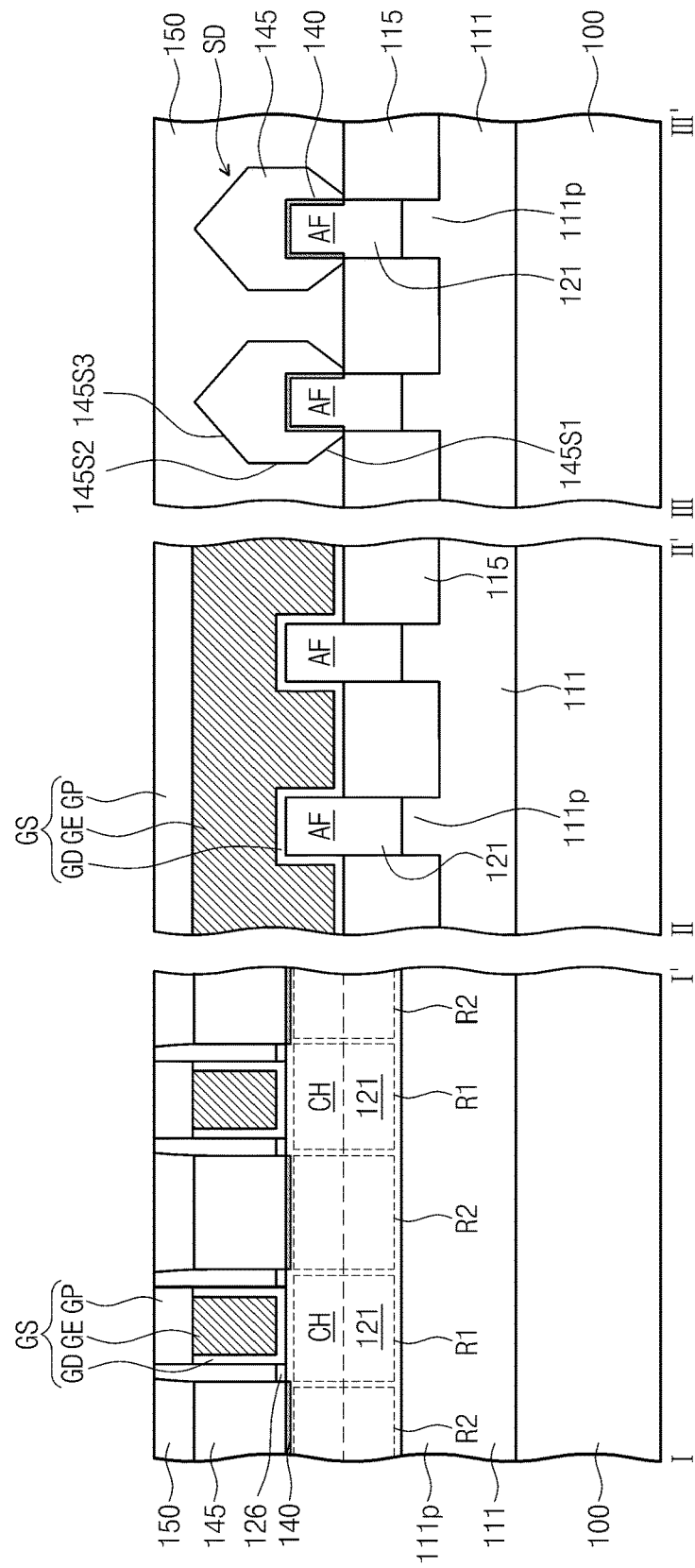
FIG. 3 is a sectional view illustrating a semiconductor device according to another example embodiment of the inventive concepts.

FIG. 3 is a sectional view illustrating a semiconductor device according to another example embodiment of the inventive concepts. In detail, FIG. 3 illustrates vertical sections taken along lines I-I', II-II', and III-III' of FIG. 1. In the following description, a previously-described element may be identified by a similar or identical reference number without repeating an overlapping description thereof, for the sake of brevity.

Referring to FIGS. 1 and 3, the active patterns 121 may include first regions R1 positioned below the gate structures GS and second regions R2 positioned at both sides of the gate structures GS. In the present embodiment, the second regions R2 may have top surfaces substantially coplanar with those of the first regions R1. In other words, the top surfaces of the first regions R1 may be positioned at substantially the same level as those of the second regions R2. Here, upper portions of the first regions R1, which are positioned below the gate structures GS and exposed by the device isolation patterns 115, may serve as the channel regions CH.

Cladding layers 145 may be provided on the second regions R2 of the active patterns 121. The cladding layers 145 may cover top and side surfaces of the second regions R2 exposed by the device isolation patterns 115. In example embodiments, the cladding layers 145 may be patterns that are epitaxially grown using the exposed top and side surfaces of the second regions R2 as a seed layer. In the case of the PMOSFET, the cladding layers 145 may include a material capable of exerting a compressive strain to the channel regions CH. For example, in the case where the active patterns 121 includes a SiGe layer, the cladding layers 145 may include a SiGe layer having a larger lattice constant, or a higher germanium concentration, than that of the active patterns 121. In the case of the NMOSFET, the cladding layers 145 may include a material capable of exerting a tensile strain to the channel regions CH. For example, in the case where the active patterns 121 includes a SiGe layer, the cladding layers 145 may include a Si or SiC layer, whose lattice constant is smaller than that of the active patterns 121, or a SiGe layer, whose germanium concentration is lower than that of the active patterns 121. The cladding layers 145 may be doped to have the p- or n-conductivity type. In addition, a portion of the second regions R2 adjacent to the cladding layers 145 may be doped to have the p- or n-conductivity type. The cladding layers 145 and the doped portions of the second regions R2 may serve as the source/drain regions SD of MOSFETs.

Each of the cladding layers 145 may have a first sidewall 145S1, which is inclined at a substantially negative angle with respect to the top surface of the substrate 100, a second sidewall 145S2, which is substantially perpendicular to the top surface of the substrate 100, and a third sidewall 145S3, which is inclined at a substantially positive angle with respect to the top surface of the substrate 100. The second sidewall 145S2 may meet the first sidewall 145S1 thereunder to form a lower vertex and may also meet the third sidewall 145S3 thereon to form an upper vertex.

The barrier layer 140 may be interposed between the cladding layers 145 and the active patterns 121. The barrier layer 140 may be interposed between the cladding layers 145 and the top surfaces of the second regions R2 and between the cladding layers 145 and the sidewalls of the second regions R2. The barrier layer 140 may include the same element as that contained in the active patterns 121. For example, in the case where the active patterns 121 include silicon germanium, the barrier layer 140 may include germanium. The barrier layer 140 may have a thickness ranging from about 0 nm to about 3 nm.

A method of fabricating a semiconductor device, according to example embodiments of the inventive concepts, will be described with reference to FIGS. 4 through 17, each of which illustrates vertical sections taken along lines I-I', II-II', and III-III' of FIG. 1.

Figure 4:
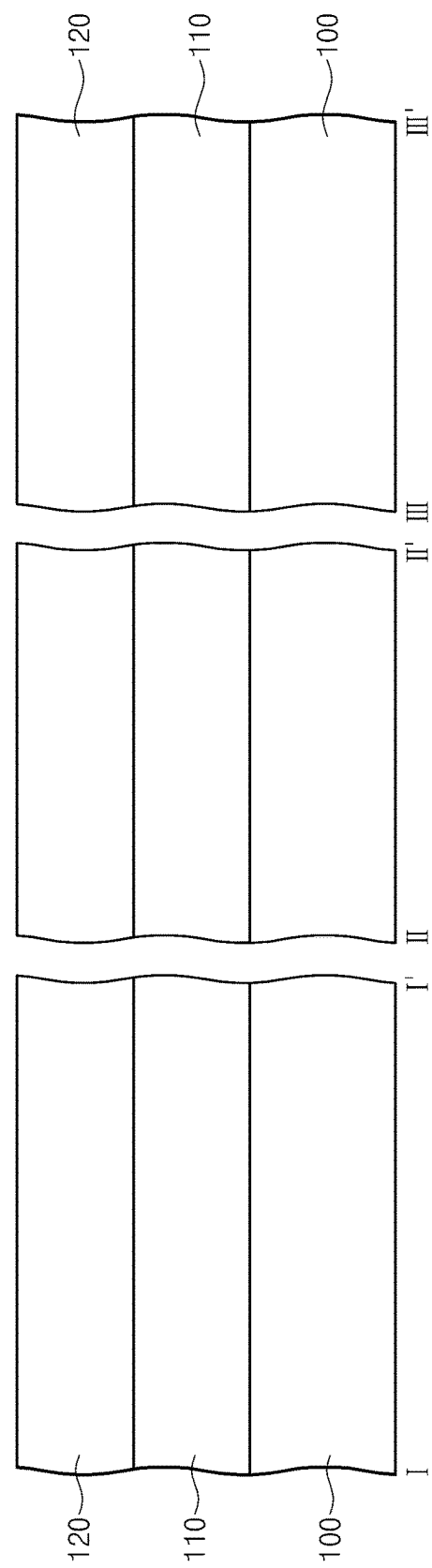
FIGS. 4 through 17 are sectional views illustrating a method of fabricating a semiconductor device, according to yet another example embodiment of the inventive concepts.

Referring to FIG. 4, a buffer layer 110 and an active layer 120 may be sequentially formed on the substrate 100. The substrate 100 may be or include a semiconductor wafer, which is made of at least one of silicon, germanium, silicon germanium, or III-V semiconductor compounds. The buffer layer 110 may be formed of or include a material whose lattice constant is different from that of the substrate 100. For example, the buffer layer 110 may be formed of a material whose lattice constant is larger than that of the substrate 100. In certain embodiments, the buffer layer 110 may be formed of or include a material, whose lattice structure is the same as that of the active layer 120, but whose lattice constant is different from that of the active layer 120.

In the case of PMOS field effect transistors, the buffer layer 110 may be formed to exert a compressive strain to the active layer 120. For example, the buffer layer 110 may be formed to have a lattice constant smaller than that of the active layer 120. As an example, the buffer layer 110 may be formed of a Si1-xGex layer, and the active layer 120 may be formed of a Ge layer. As another example, the buffer layer 110 may be formed of a Si1-zGez layer, and the active layer 120 may be formed of a Si1-wGew layer (where z<w). As still other example, the buffer layer 110 may be formed of an In1-zGazAs layer, and the active layer 120 may be formed of an In1-wGawAs layer (where z>w).

In the case of NMOS field effect transistors, the buffer layer 110 may be formed to exert a tensile strain to the active layer 120. For example, the buffer layer 110 may be formed to have a lattice constant larger than that of the active layer 120. As an example, the buffer layer 110 may be formed of a Si1-xGex layer, and the active layer 120 may be formed of a Si layer. As another example, the buffer layer 110 may be formed of a Si1-xGex layer, and the active layer 120 may be formed of a Si1-yGey layer (where x>y). As still other example, the buffer layer 110 may be formed of an In1-xGaxAs layer, and the active layer 120 may be formed of an In1-yGayAs layer (where x<y).

The buffer layer 110 may be formed by an epitaxial growth process, in which the substrate 100 is used as a seed layer, and the active layer 120 may be formed by an epitaxial growth process, in which the buffer layer 110 is used as a seed layer. The epitaxial growth processes may be performed using, for example, a chemical vapor deposition (CVD) technology or a molecular beam epitaxy (MBE) technology. In example embodiments, the buffer layer 110 and the active layer 120 may be successively formed in the same chamber. Hereinafter, for concise description, an example of the present embodiments, in which the substrate 100 is a silicon wafer and the buffer and active layers 110 and 120 are formed of a silicon germanium (SiGe) layer, will be described.

Figure 5:
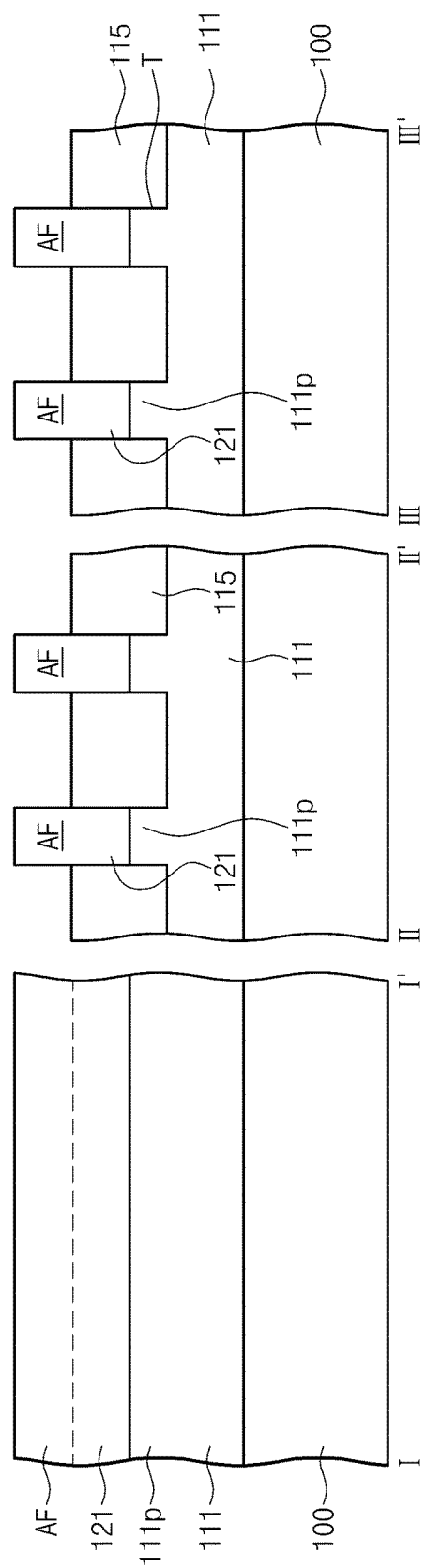

Referring to FIG. 5, the active layer 120 may be patterned to form trenches T defining the active patterns 121.

In example embodiments, the formation of the trenches T may include forming mask patterns (not shown) on the active layer 120 and performing an anisotropic etching process using the mask patterns as an etch mask. The anisotropic etching process may be performed to etch an upper portion of the buffer layer 110 and thereby form the buffer pattern 111. The buffer pattern 111 may include the protrusions 111p defined by the trenches T. In other words, the active patterns 121 may be formed on the top surfaces of the protrusions 111p. As shown in FIG. 1, the active patterns 121 may extend in the first direction D1 and may be spaced apart from each other in the second direction D2 crossing the first direction D1.

Thereafter, the device isolation patterns 115 may be formed in the trenches T. The device isolation patterns 115 may be formed to expose upper portions of the active patterns 121. In example embodiments, the formation of the device isolation patterns 115 may include forming a device isolation layer on the substrate 100 to fill the trenches T and cover the active patterns 121, and then, planarizing the device isolation layer to expose the top surfaces of the active patterns 121. Next, the planarized device isolation layer may be recessed to form the device isolation patterns 115 exposing the upper portions of the active patterns 121. The upper portions of the active patterns 121 exposed by the device isolation patterns 115 may serve as the active fins AF. The device isolation patterns 115 may be formed of or include at least one of, for example, silicon oxide, silicon nitride, or silicon oxynitride.

Figure 6:
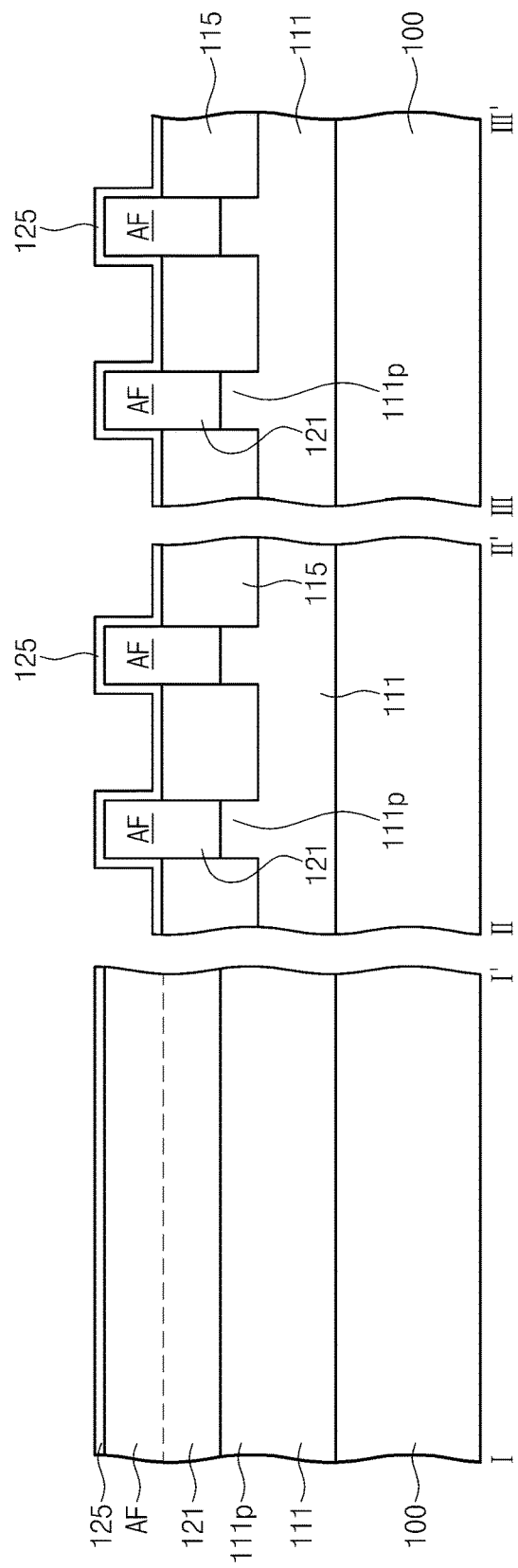

Referring to FIG. 6, a liner layer 125 may be formed on the substrate 100. The liner layer 125 may be formed to cover the device isolation patterns 115 and the upper portions of the active patterns 121. In other words, the liner layer 125 may cover the top and side surfaces of the active fins AF and the top surfaces of the device isolation patterns 115. According to example embodiments of the inventive concepts, the liner layer 125 may be formed of a nitride-based material. For example, the liner layer 125 may include at least one of silicon nitride (SiN), silicon carbonitride (SiCN), silicon boron nitride (SiBN), or silicon carbon boron nitride (SiCBN). The liner layer 125 may be formed by an atomic layer deposition (ALD) process, a low pressure chemical vapor deposition (LPCVD) process, a plasma-enhanced chemical vapor deposition (PECVD) process, or a plasma nitration process. The liner layer 125 may prevent or inhibit the active fins AF from being damaged in a subsequent process. For example, due to the presence of the liner layer 125, it is possible to prevent or inhibit portions of the active fins AF covered with the liner layer 125 from being oxidized in a subsequent thermal process for forming a sacrificial gate pattern 134 (e.g., of FIG. 7) or by oxygen atoms contained in the sacrificial gate pattern 134.

Figure 7:
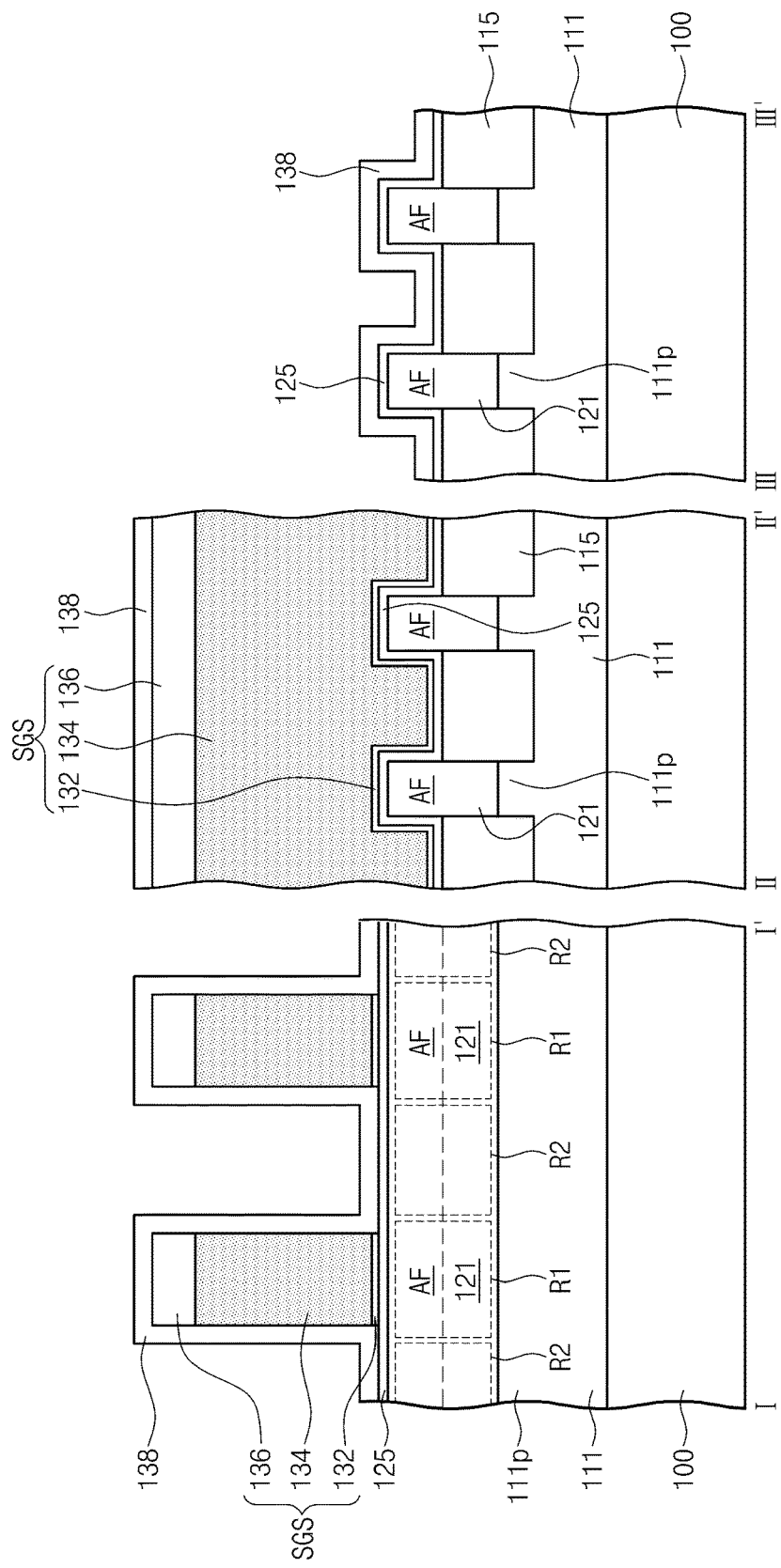

Referring to FIG. 7, sacrificial gate structures SGS may be formed on the substrate 100. The sacrificial gate structures SGS may be arranged in the first direction D1 (e.g., shown in FIG. 1) and may extend in the second direction D2 (e.g., of FIG. 2) to cross the active patterns 121.

Each of the sacrificial gate structures SGS may include an etch stop pattern 132, a sacrificial gate pattern 134, and a gate mask pattern 136, which are sequentially stacked on the substrate 100. The etch stop pattern 132 and the sacrificial gate pattern 134 may be formed to cover the active fins AF and top surfaces of the device isolation patterns 115. The gate mask pattern 136 may be formed on a top surface of the sacrificial gate pattern 134 to extend along the sacrificial gate pattern 134. The sacrificial gate structures SGS may be formed by sequentially forming an etch stop layer, a sacrificial gate layer, and a gate mask layer on the substrate 100 to cover the active fins AF and then patterning these layers. The etch stop layer may include a material having an etch selectivity with respect to the liner layer 125. As an example, the etch stop layer may be formed of or include a silicon oxide layer. The sacrificial gate layer may include a material having an etch selectivity with respect to the etch stop layer. For example, the sacrificial gate layer may be formed of or include a poly silicon layer. The sacrificial gate layer may be formed a chemical vapor deposition (CVD), physical vapor deposition (PVD), or atomic layer deposition (ALD) process. The gate mask layer may be formed of or include a silicon nitride layer or a silicon oxynitride layer.

Since the sacrificial gate structure SGS is formed to cross the active pattern 121, the first region R1 and the second regions R2 may be defined in each of the active patterns 121. For example, the first region R1 may be a portion of the active pattern 121 positioned below and overlapping the sacrificial gate structure SGS. The second regions R2 may be other portions of the active pattern 121 that are positioned at both sides of the sacrificial gate structure SGS and are horizontally spaced apart from each other by the first region R1.

Next, a gate spacer layer 138 may be formed on the substrate 100 to conformally cover the sacrificial gate structures SGS. The gate spacer layer 138 may be formed of or include a silicon nitride layer or a silicon oxynitride layer. The gate spacer layer 138 may be formed by a deposition process (e.g., CVD or ALD).

Figure 8:
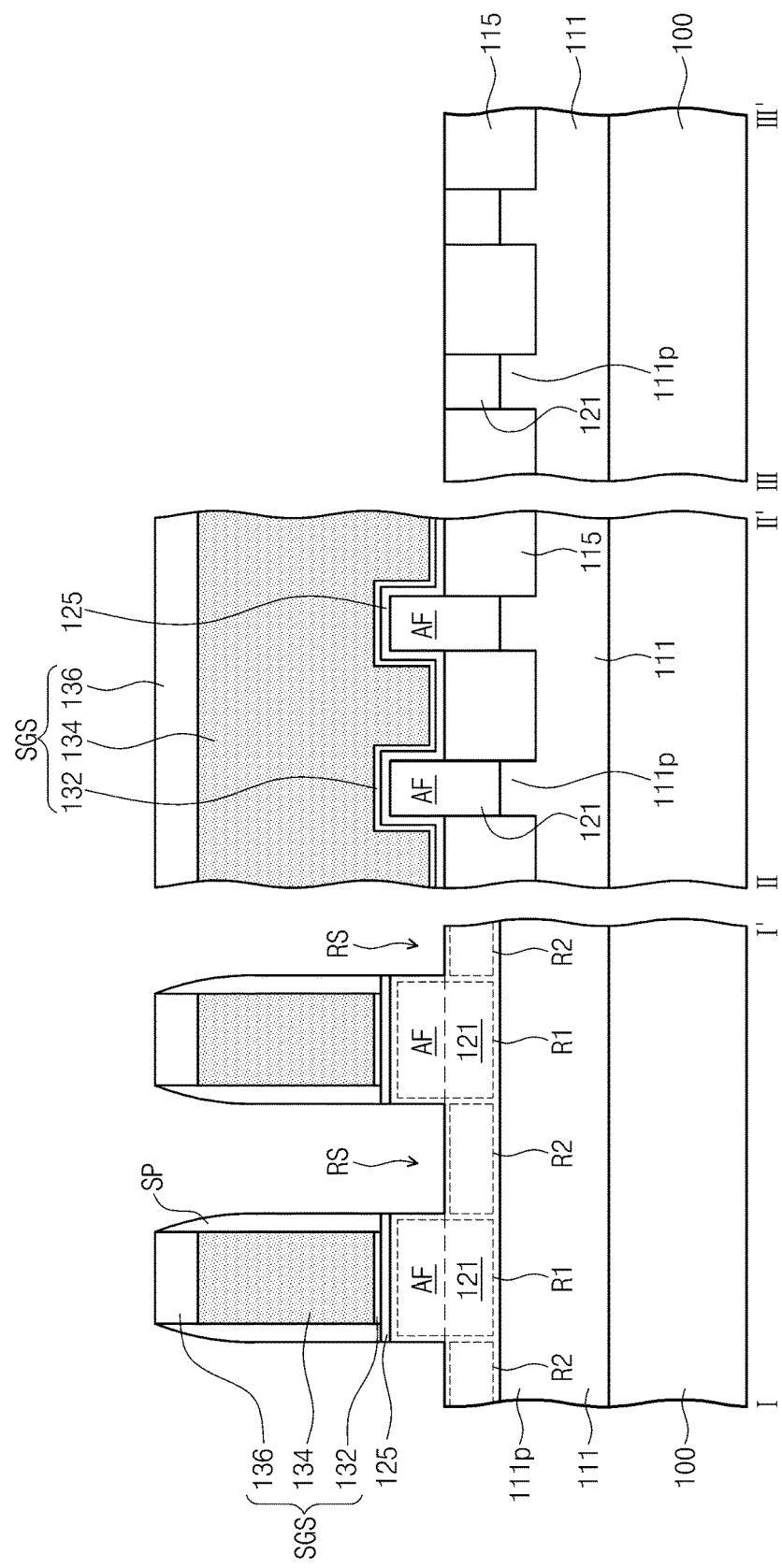

Referring to FIG. 8, upper portions of the active patterns 121 may be removed from both sides of the sacrificial gate structures SGS. For example, upper portions of the second regions R2 of the active patterns 121 may be removed. Accordingly, recess regions RS may be formed in the active patterns 121. Bottom surfaces of the recess regions RS may correspond to the top surfaces of the second regions R2 that are lower than those of the first regions R1. The recess regions RS may be formed to partially expose the first regions R1. In the present embodiment, side surfaces of the recess regions RS (i.e., upper side surfaces of the first regions R1) are illustrated to be perpendicular to the top surface of the substrate 100, but example embodiments of the inventive concepts are not limited thereto. For example, the side surfaces of the recess regions RS may be formed to have a convex profile.

In example embodiments, the removal of the active patterns 121 may include forming a mask pattern (not shown) on the substrate 100 and performing an etching process using the mask pattern as an etch mask. The etching process may be performed in a dry or wet etching manner. During the etching process, the gate spacer layer 138 may also be etched to form the gate spacers SP on the sidewalls of the sacrificial gate structures SGS. Furthermore, the etching process may be performed to remove the liner layer 125 exposed by the sacrificial gate structures SGS. In other words, the liner layer 125 may be partially removed to expose the second regions R2. As a result, the liner layer 125 may remain between the sacrificial gate structures SGS and the first regions R1 and between the sacrificial gate structures SGS and the device isolation patterns 115.

Figure 9:
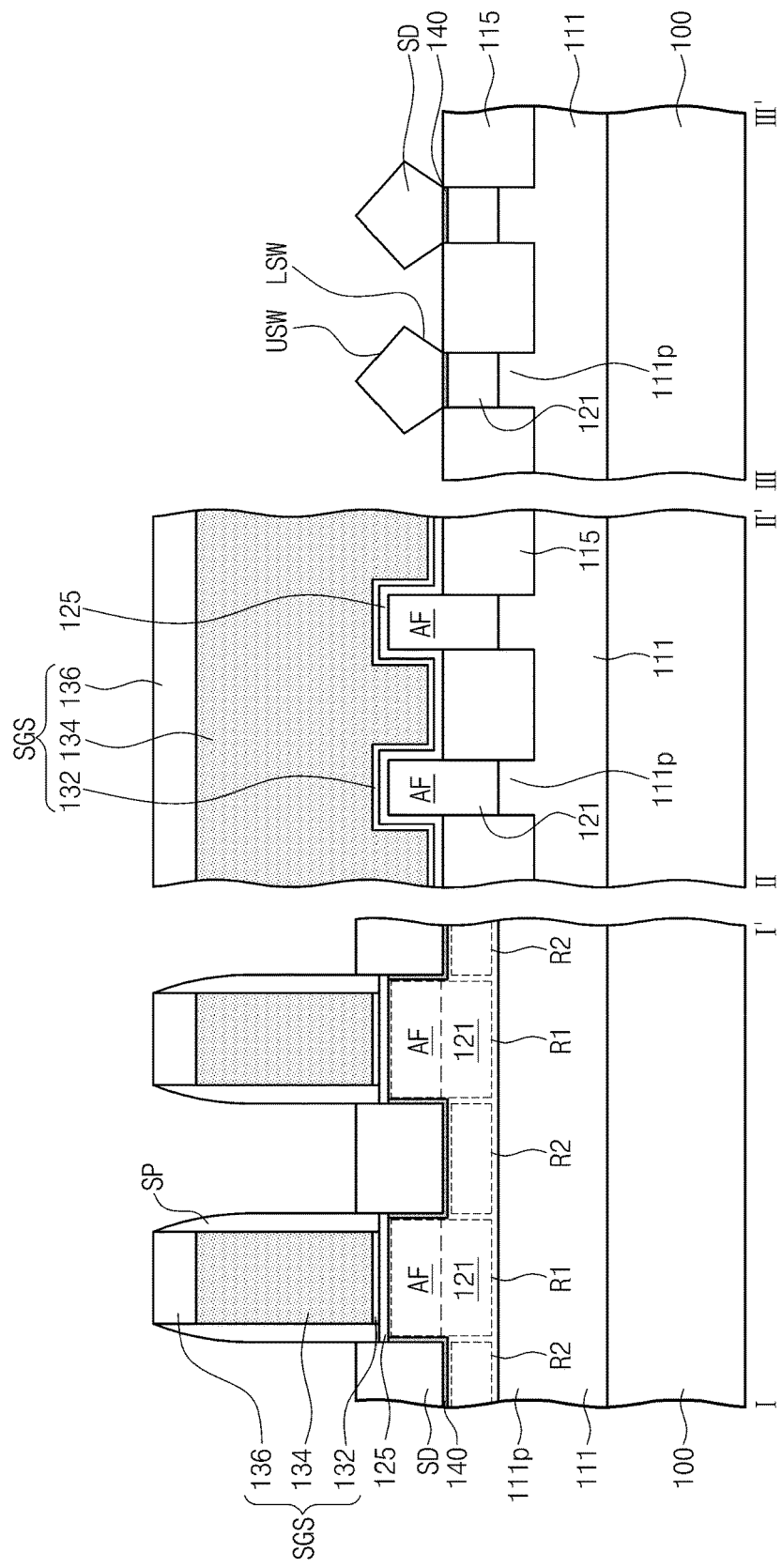

Referring to FIG. 9, the source/drain regions SD may be formed at both sides of the sacrificial gate structures SGS. In other words, the source/drain regions SD may be formed on the second regions R2 of the active patterns 121. The source/drain regions SD may be formed to fill the recess regions RS. In example embodiments, the source/drain regions SD may be formed by a selective epitaxial growth process, in which a surface of the active patterns 121 exposed by the recess regions RS is used as a seed layer. In other words, the source/drain regions SD may include an epitaxial layer. For the PMOSFETs, the source/drain regions SD may be formed of a material capable of exerting a compressive strain to the active fins AF. For example, in the case where the active patterns 121 includes a SiGe layer, the source/drain regions SD may be formed of a SiGe layer having a larger lattice constant, or a higher germanium concentration, than that of the active patterns 121. By contrast, for the NMOSFETs, the source/drain regions SD may be formed of a material capable of exerting a tensile strain to the active fins AF. For example, in the case where the active patterns 121 includes a SiGe layer, the source/drain regions SD may be formed of a Si or SiC layer, whose lattice constant is smaller than that of the active patterns 121, or a SiGe layer, whose germanium concentration is lower than that of the active patterns 121. However, example embodiments of the inventive concepts are not limited thereto. During or after the epitaxial growth process, the source/drain regions SD may be doped with impurities to have a p- or n-conductivity type.

Each of the source/drain regions SD may have the lower sidewall LSW, which is inclined at a substantially negative angle with respect to the top surface of the substrate 100, and the upper sidewall USW, which is inclined at a substantially positive angle with respect to the top surface of the substrate 100. The lower sidewall LSW may meet the upper sidewall USW adjacent thereto to form a vertex.

In example embodiments, before or during the formation of the source/drain regions SD, a preconditioning process may be performed on the substrate 100. The preconditioning process may be, for example, a thermal treatment process or a plasma treatment process, which may be performed using hydrogen. The thermal treatment process or the plasma treatment process may be performed at a temperature of 400° C. or higher. After a dry or wet etching process for forming the recess regions RS, a natural oxide layer may be formed on surfaces of the active patterns 121 exposed by the recess regions RS. In the case where, as in the present embodiment, the active patterns 121 include a Ge-containing layer (e.g., a SiGe layer), the natural oxide layer may be more easily formed on the active patterns 121 than on the active patterns 121 that are formed of a silicon layer. Accordingly, it is necessary to remove the natural oxide layer from the surfaces of the active patterns 121 exposed by the recess regions RS, before or during the epitaxial growth process for forming the source/drain regions SD. The preconditioning process may be performed to remove such a natural oxide layer.

As a result of the preconditioning process, the barrier layer 140 may be formed on the surfaces of the active patterns 121 exposed by the recess regions RS. In other words, the barrier layer 140 may be formed between the source/drain regions SD and the active patterns 121. The barrier layer 140 may include germanium contained in the buffer pattern 111 and the active patterns 121. During the preconditioning process, germanium atoms in the buffer pattern 111 and the active patterns 121 may be segregated in the surface of the active patterns 121 exposed by the recess regions RS, thereby forming the barrier layer 140. The barrier layer 140 may be formed to have a thickness ranging from about 0 nm to about 3 nm.

As described above, the formation of the source/drain regions SD may include removing the upper portions of the second regions R2 to form the recess regions RS and performing a selective epitaxial process, in which the active patterns 121 exposed by the recess regions RS is used as a seed layer. However, example embodiments of the inventive concepts are not limited thereto. In other example embodiments, the process for removing the upper portions of the second regions R2 may be omitted, as will be described in more detail with reference to FIGS. 10 and 11.

Figure 10:
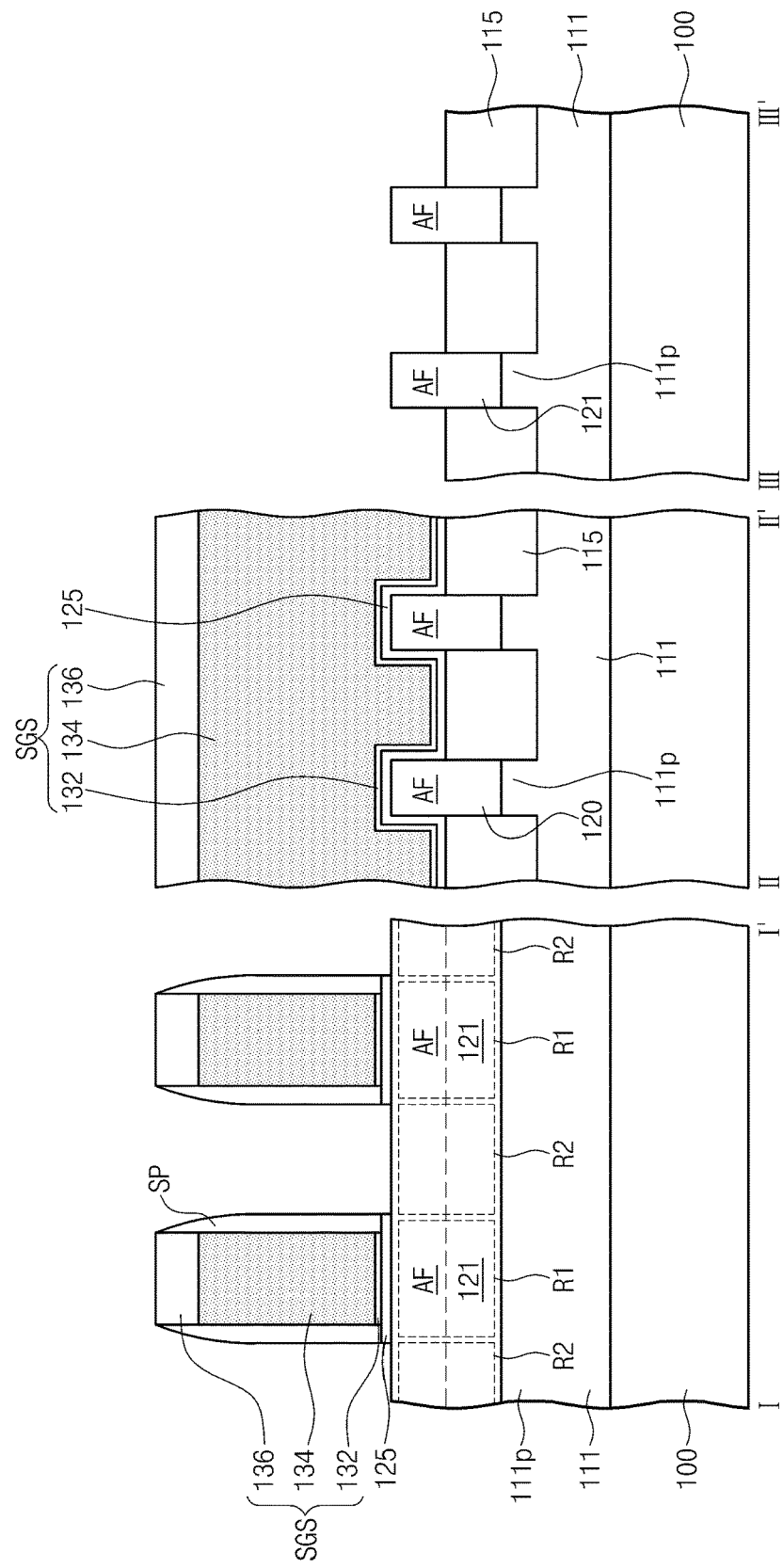

Referring to FIG. 10, an anisotropic etching process may be performed on the structure of FIG. 7. The anisotropic etching process may be performed to expose the top and side surfaces of the second regions R2 and the top surfaces of the device isolation patterns 115 positioned at both sides of the sacrificial gate structures SGS. Accordingly, the gate spacers SP may be formed on the sidewalls of the sacrificial gate structures SGS. In addition, the liner layer 125 exposed by the sacrificial gate structures SGS may be removed. The anisotropic etching process may include, for example, a reactive ion etching process, but example embodiments of the inventive concepts are not limited thereto. Furthermore, during the anisotropic etching process, the top surfaces of the sacrificial gate structures SGS may be exposed and thus the gate mask patterns 136 may be partially etched. In the case where, unlike that of FIG. 8, the process of removing the second regions R2 is omitted, the top surfaces of the first regions R1 may be formed to be substantially coplanar with those of the second regions R2. In other words, the top surfaces of the first regions R1 may be positioned at substantially the same level as those of the second regions R2.

Figure 11:
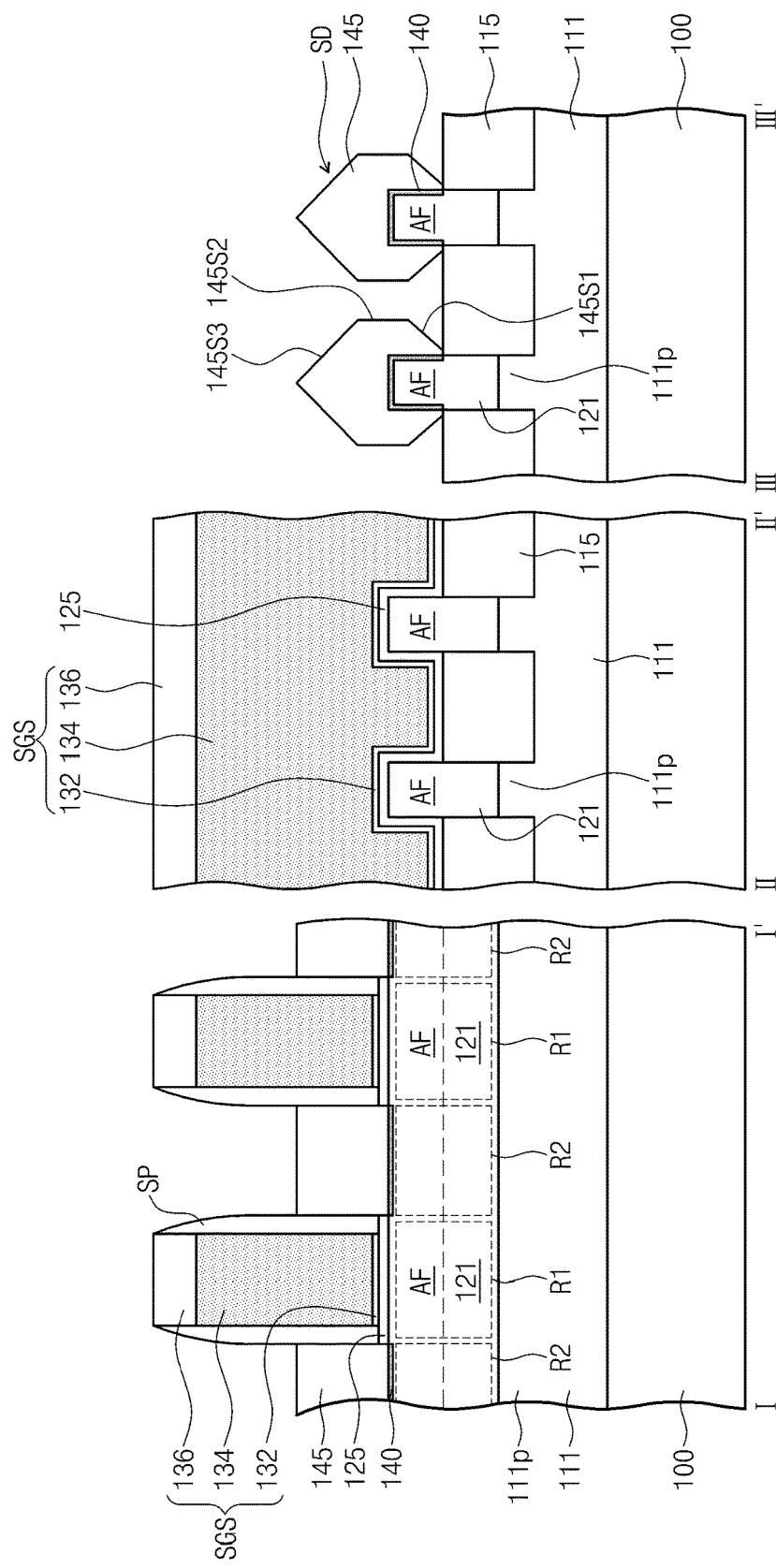

Referring to FIG. 11, the cladding layers 145 may be formed at both sides of the sacrificial gate structures SGS. In other words, the cladding layers 145 may be formed on the second regions R2 of the active patterns 121. In example embodiments, the cladding layers 145 may be formed by a selective epitaxial growth process, in which the top and side surfaces of the second regions R2 exposed by the device isolation patterns 115 is used as a seed layer. In other words, the cladding layers 145 may be an epitaxially grown layer. For the PMOSFETs, the cladding layers 145 may be formed of a material capable of exerting a compressive strain to the active fins AF. For example, in the case where the active patterns 121 includes a SiGe layer, the cladding layers 145 may be formed of a SiGe layer having a larger lattice constant, or a higher germanium concentration, than that of the active patterns 121. By contrast, for the NMOSFETs, the cladding layers 145 may be formed of a material capable of exerting a tensile strain to the active fins AF. For example, in the case where the active patterns 121 includes a SiGe layer, the cladding layers 145 may be formed of a Si or SiC layer, whose lattice constant is smaller than that of the active patterns 121, or a SiGe layer, whose germanium concentration is lower than that of the active patterns 121. But example embodiments of the inventive concepts are not limited thereto. During or after the epitaxial growth process, the cladding layers 145 may be doped with impurities. In certain embodiments, during the doping of the cladding layers 145, the second regions R2 may be partially doped with the impurities. Accordingly, the cladding layers 145 and the doped portions of the second regions R2 may serve as the source/drain regions SD of MOSFETs. The conductivity type of the source/drain regions SD may be a p-type or an n-type.

Each of the cladding layers 145 may have the first sidewall 145S1, which is inclined at a substantially negative angle with respect to the top surface of the substrate 100, the second sidewall 145S2, which is substantially perpendicular to the top surface of the substrate 100, and the third sidewall 145S3, which is inclined at a substantially positive angle with respect to the top surface of the substrate 100. The second sidewall 145S2 may meet the first sidewall 145S1 thereunder to form a lower vertex and may also meet the third sidewall 145S3 thereon to form an upper vertex.

In example embodiments, before or during the formation of the cladding layers 145, the preconditioning process described with reference to FIG. 9 may be performed on the substrate 100. The preconditioning process may be, for example, a thermal treatment process or a plasma treatment process, which may be performed using hydrogen. The thermal treatment process or the plasma treatment process may be performed at a temperature of 400° C. or higher. The preconditioning process may be performed to remove a natural oxide layer from the surfaces of the second regions R2 exposed by the device isolation patterns 115. As a result of the preconditioning process, the barrier layer 140 may be formed on the surfaces of the second regions R2 exposed by the device isolation patterns 115. In other words, the barrier layer 140 may be formed between the cladding layers 145 and the top surfaces of the second regions R2 and between the cladding layers 145 and the side surfaces of the second regions R2. The barrier layer 140 may include germanium contained in the buffer pattern 111 and the active patterns 121. During the preconditioning process, germanium atoms in the buffer pattern 111 may be diffused along the surfaces of the second regions R2 of the active patterns 121 and/or germanium atoms in the active patterns 121 may be segregated in the surface of the second regions R2 exposed by the device isolation patterns 115, thereby forming the barrier layer 140. The barrier layer 140 may be formed to have a thickness ranging from about 0 nm to about 3 nm.

Next, a process of fabricating a semiconductor device may continue. Hereinafter, an example, in which a subsequent process is performed on the structure of FIG. 9, will be described, for concise description.

Figure 12:
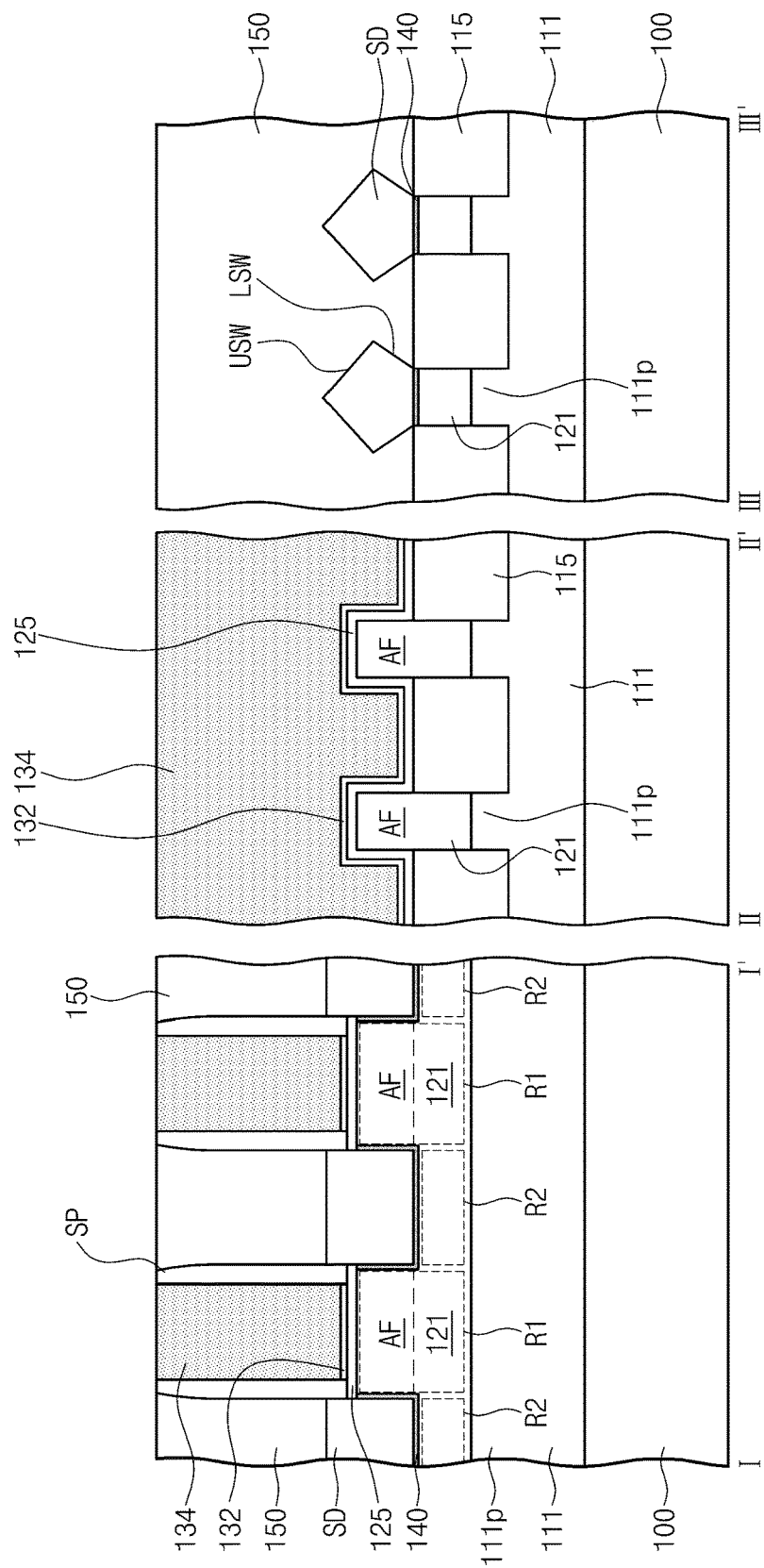

Referring to FIG. 12, the lower interlayer insulating layer 150 may be formed on the structure provided with the source/drain regions SD to expose the top surfaces of the sacrificial gate patterns 134.

For example, the lower interlayer insulating layer 150 may be formed to cover the source/drain regions SD and the sacrificial gate structures SGS. The lower interlayer insulating layer 150 may be formed of or include at least one of, for example, a silicon oxide layer or low-k dielectric layers. Thereafter, a planarization process may be performed to expose the top surfaces of the sacrificial gate patterns 134. The planarization process may include an etch-back process and/or a chemical mechanical polishing (CMP) process. The planarization process may be performed to remove the gate mask patterns 136, a portion of the lower interlayer insulating layer 150, and a portion of the gate spacers SP. Accordingly, the sacrificial gate patterns 134 may be exposed, and the sacrificial gate patterns 134, the gate spacers SP, and the lower interlayer insulating layer 150 may be formed to have top surfaces that are substantially coplanar with each other.

Figure 13:
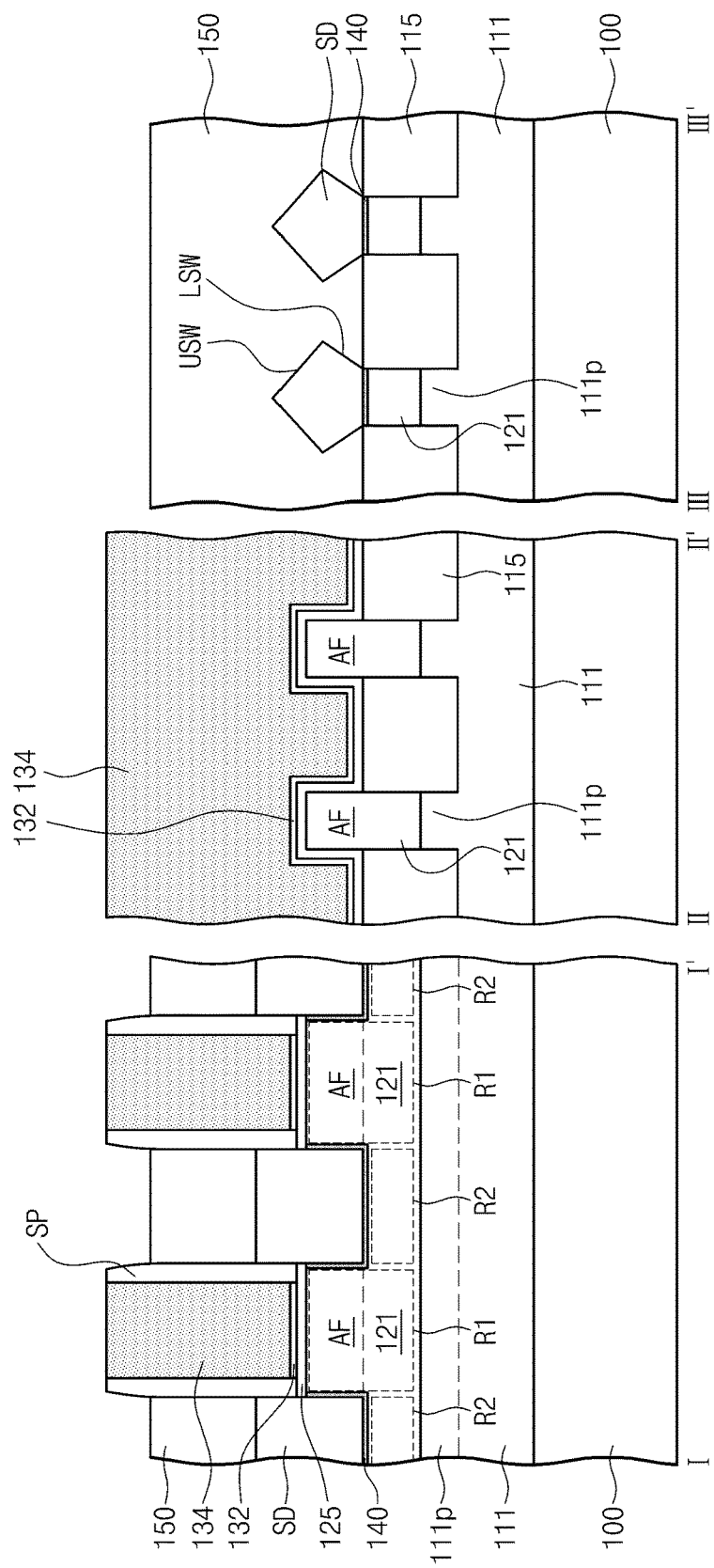

Referring to FIG. 13, the lower interlayer insulating layer 150 may be recessed. The recessing of the lower interlayer insulating layer 150 may be performed using an etching process of selectively removing a portion of the lower interlayer insulating layer 150. In other words, the etching process may be performed using an etchant, which may be selected to have a sufficiently high etch selectivity with respect to the sacrificial gate patterns 134 and the gate spacers SP. As a result, the lower interlayer insulating layer 150 may be formed to have a top surface lower than those of the sacrificial gate patterns 134. In addition, the sidewalls of the gate spacers SP may be partially exposed.

Figure 14:
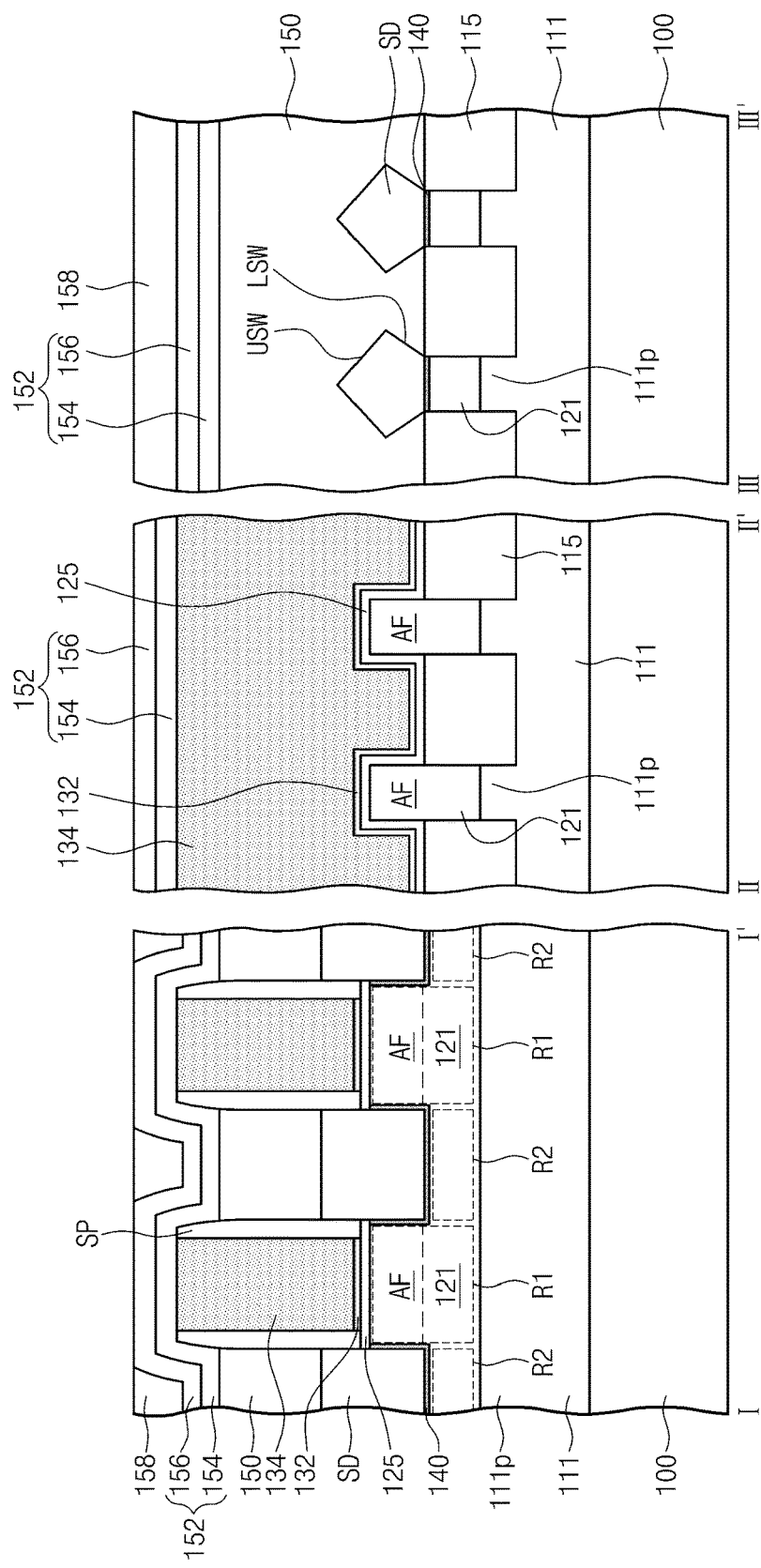

Referring to FIG. 14, a capping insulating layer 152 may be conformally formed on the structure of FIG. 13. The capping insulating layer 152 may formed to cover the top surface of the lower interlayer insulating layer 150 and the top surface of the sacrificial gate patterns 134. Accordingly, the capping insulating layer 152 may have a stepwise top surface. The capping insulating layer 152 may include a nitride-based material having an etch selectivity with respect to the sacrificial gate pattern 134, the etch stop pattern 132, and the liner layer 125. As an example, the capping insulating layer 152 may be formed of or include a silicon oxycarbonitride (SiOCN) layer. The capping insulating layer 152 may be formed to have a single-layered or multi-layered structure. In example embodiments, the capping insulating layer 152 may include a first capping insulating layer 154 adjacent to the lower interlayer insulating layer 150 and a second capping insulating layer 156 on the first capping insulating layer 154. At least one of the first and second capping insulating layers 154 and 156 may be formed of or include a silicon oxycarbonitride (SiOCN) layer. As an example, the first capping insulating layer 154 may be formed of or include the same material as the liner layer 125 (e.g., at least one of silicon nitride (SiN), silicon carbonitride (SiCN), silicon boron nitride (SiBN), or silicon carbon boron nitride (SiCBN)), and the second capping insulating layer 156 may be formed of or include silicon oxycarbonitride (SiOCN). As another example, the first capping insulating layer 154 may be formed of or include silicon oxycarbonitride (SiOCN), and the second capping insulating layer 156 may be formed of or include the same material as the liner layer 125. As still other example, both of the first and second capping insulating layers 154 and 156 may be formed of or include silicon oxycarbonitride (SiOCN). In this case, the capping insulating layer 152 may have a substantially single-layered structure. The capping insulating layer 152 may be formed by, for example, a chemical vapor deposition process or an atomic layer deposition process.

Thereafter, a protection insulating layer may be conformally formed on the capping insulating layer 152 and may be planarized to expose the capping insulating layer 152. As a result, protection insulating patterns 158 may be formed to partially expose the top surface of the capping insulating layer 152. The protection insulating layer may be formed of or include a material having an etch selectivity with respect to the capping insulating layer 152. For example, the protection insulating layer may include a silicon oxide layer, which may be formed by a chemical vapor deposition process or an atomic layer deposition process. The planarization of the protection insulating layer may be performed using an etch-back or CMP process. The portion of the capping insulating layer 152 exposed by the protection insulating patterns 158 may overlap the sacrificial gate patterns 134, when viewed in a plan view. In addition, when viewed in a plan view, the protection insulating patterns 158 may overlap other portions of the capping insulating layer 152 and the lower interlayer insulating layer 150.

Figure 15:
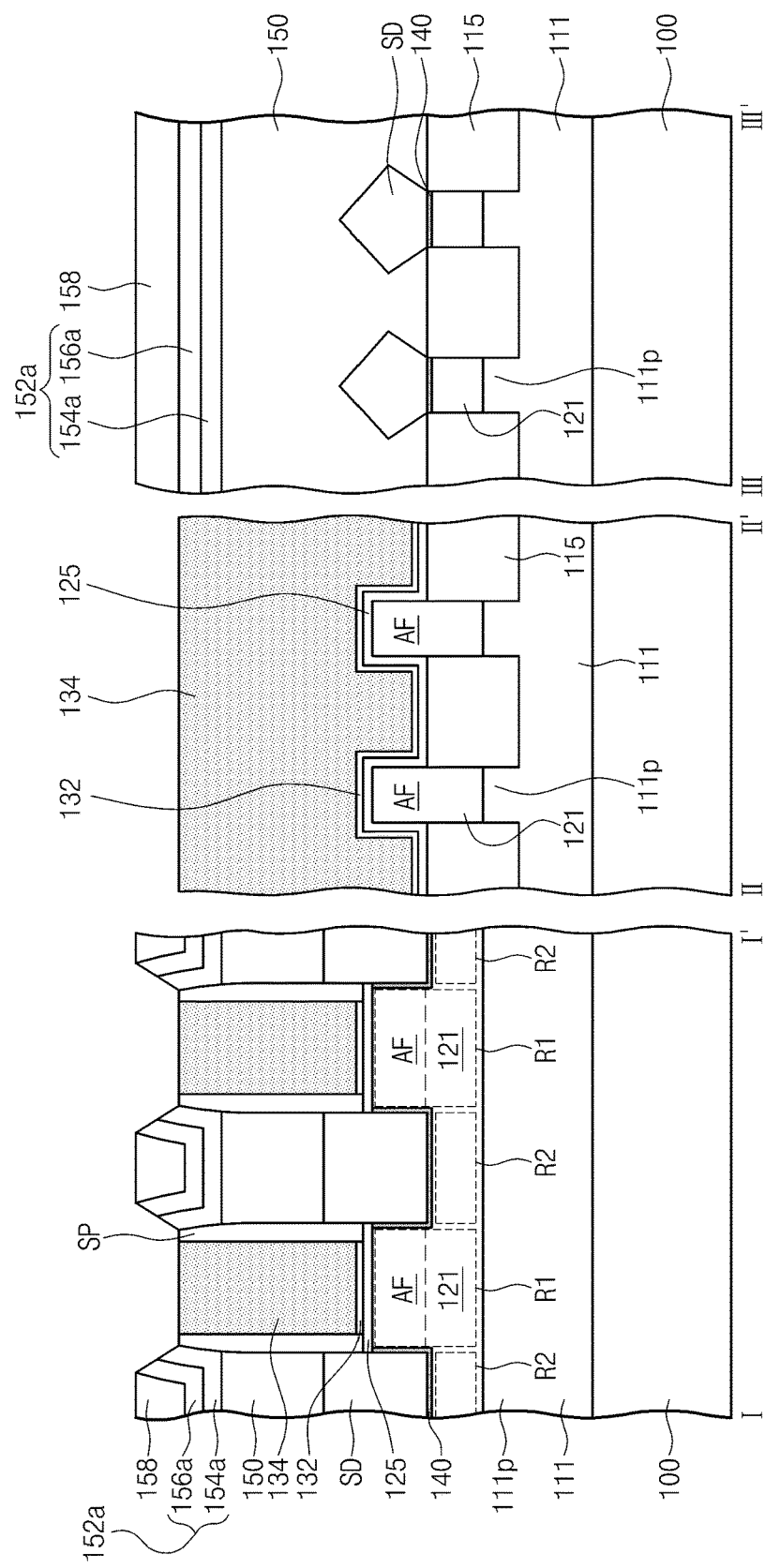

Referring to FIG. 15, the portion of the capping insulating layer 152 exposed by the protection insulating patterns 158 may be removed to expose the sacrificial gate patterns 134. The removal of the capping insulating layer 152 may include performing an etch-back process on the resulting structure of FIG. 14. The etch-back process may be performed using an etchant having an etch selectivity with respect to the protection insulating patterns 158. As a result, the capping insulating layer 152 may be patterned to form capping insulating patterns 152a exposing the sacrificial gate patterns 134. In example embodiments, the capping insulating patterns 152a may include a first capping insulating pattern 154a and a second capping insulating pattern 156a, which are formed by patterning the first and second capping insulating layers 154 and 156, respectively. After the etch-back process, the protection insulating patterns 158 may remain on the capping insulating patterns 152a, but example embodiments of the inventive concepts are not limited thereto. In other example embodiments, the protection insulating patterns 158 may be completely removed, during the etch-back process. The gate spacers SP may also be exposed by the etch-back process.

Figure 16:
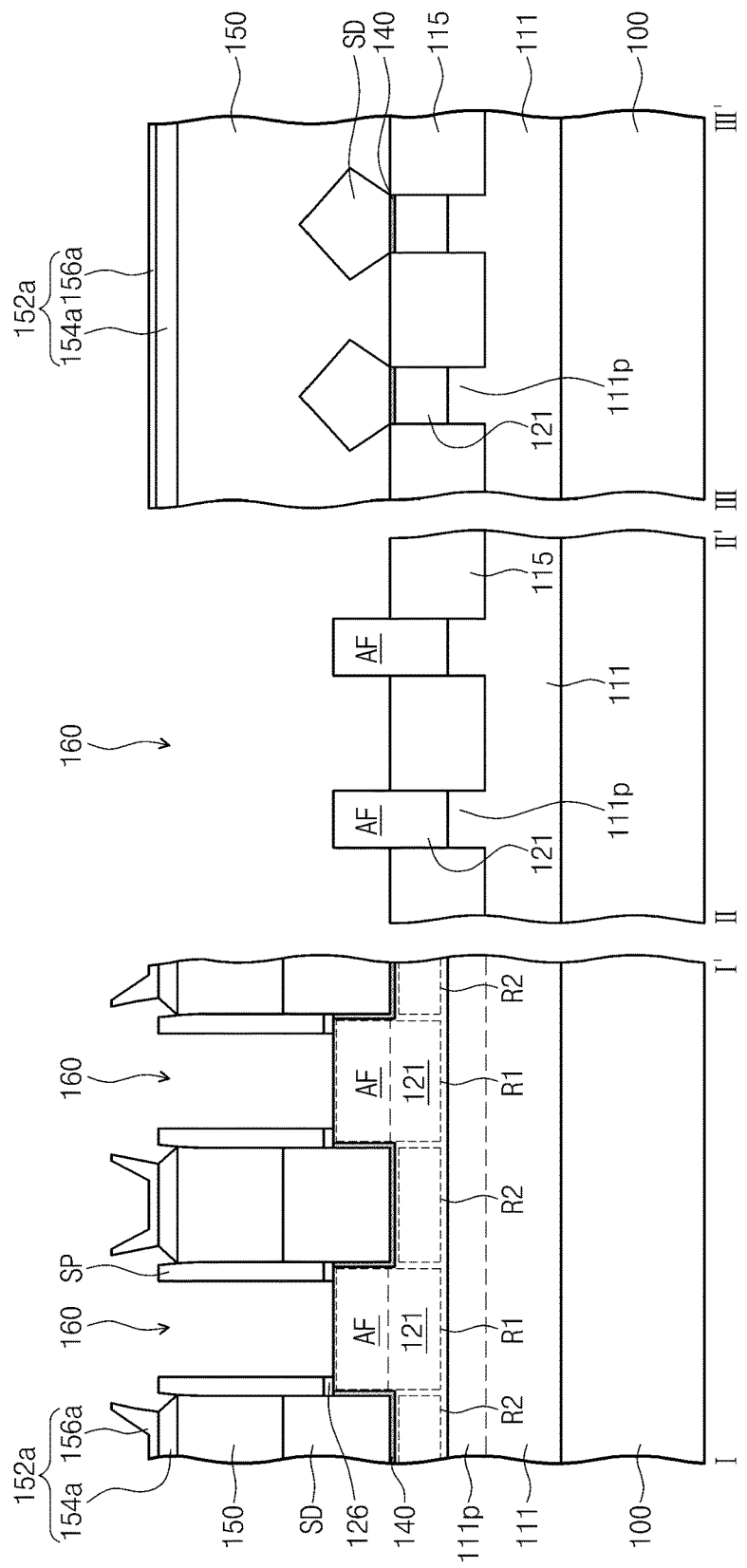

Referring to FIG. 16, the sacrificial gate pattern 134, the etch stop pattern 132, and the liner layer 125 may be removed to form gap regions 160 exposing the active fins AF between the gate spacers SP. The formation of the gap regions 160 may include etching the sacrificial gate pattern 134 with an etchant, which is selected to have an etch selectivity with respect to the gate spacers SP, the lower interlayer insulating layer 150, and the etch stop pattern 132. Furthermore, the formation of the gap regions 160 may include etching the etch stop pattern 132 to expose the liner layer 125 and etching the exposed liner layer 125 to expose the active fins AF. During the formation of the gap regions 160, the protection insulating patterns 158 may be completely removed, whereas the capping insulating patterns 152a may not be completely removed to remain on the lower interlayer insulating layer 150. Due to the presence of the capping insulating patterns 152a, it is possible to protect the lower interlayer insulating layer 150 thereunder from an etch damage, which may occur when the gap regions 160 are formed.

In the case where the capping insulating patterns 152a is formed of the same material as the liner layer 125, the capping insulating patterns 152a may be removed in the process of removing the liner layer 125 to expose the lower interlayer insulating layer 150. If the lower interlayer insulating layer 150 is exposed, the lower interlayer insulating layer 150 may be etched in the process of forming the gap regions 160 and/or in a subsequent process (e.g., a cleaning process) to have a lowered top surface. This may lead to a difficulty in a subsequent process for forming the gate electrode GE (e.g., of FIG. 2), for example, it may be difficult to realize a desired height of the gate electrode GE. By contrast, according to example embodiments of the inventive concepts, the capping insulating patterns 152a may be formed of or include a material having an etch selectivity with respect to the liner layer 125, and this makes it possible to suppress the capping insulating patterns 152a from being removed when the liner layer 125 is removed. As a result, it is possible to prevent or inhibit the lower interlayer insulating layer 150 from being lost, and thus, the process of forming the gate electrode GE can be performed with an increased process margin.

In certain embodiments, the gate spacers SP may also be etched, during the formation of the gap regions 160. The liner layer 125 may be patterned to form the liner patterns 126 localized below the gate spacers SP. The liner patterns 126 may be formed between the active patterns 121 and the gate spacers SP and may extend along the bottom surfaces of the gate spacers SP or in the second direction D2.

Figure 17:
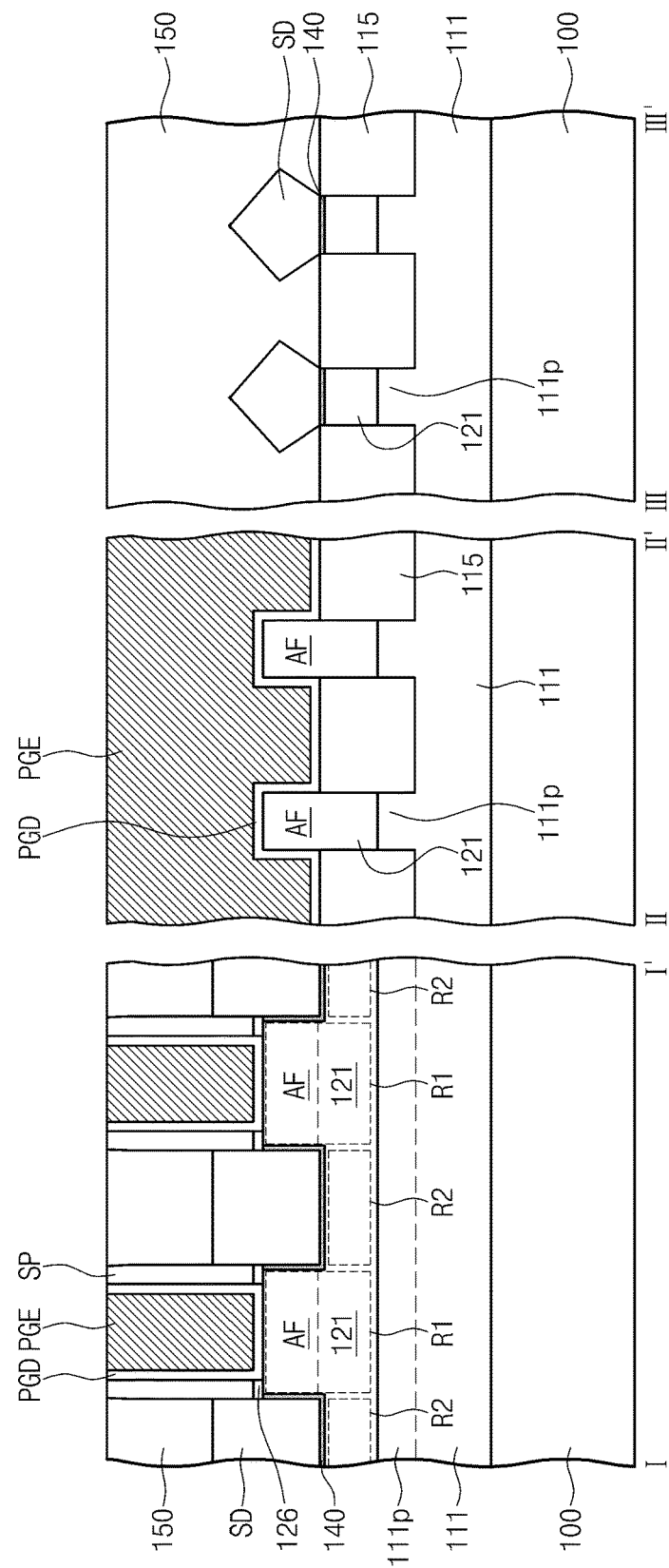

Referring to FIG. 17, a preliminary gate dielectric pattern PGD and a preliminary gate electrode PGE may be formed in each of the gap regions 160. For example, a gate dielectric layer may be formed on the substrate 100 to partially fill the gap regions 160. The gate dielectric layer may be formed to conformally cover the active fins AF. The gate dielectric layer may be formed of or include at least one of high-k dielectric materials. For example, the gate dielectric layer may be formed of or include at least one of hafnium oxide, hafnium silicate, zirconium oxide, or zirconium silicate, but example embodiments of the inventive concepts are not limited thereto. The gate dielectric layer may be formed by, for example, an atomic layer deposition process. Thereafter, a gate layer may be formed on the gate dielectric layer to fill the remaining regions of the gap regions 160. The gate layer may be formed of or include at least one of conductive metal nitrides (e.g., titanium nitride or tantalum nitride) or metals (e.g., aluminum or tungsten). The gate dielectric layer and the gate layer may be planarized to form the preliminary gate dielectric pattern PGD and the preliminary gate electrode PGE. The planarization process may include an etch-back process and/or a CMP process. The planarization process may be performed to completely remove the capping insulating patterns 152a and expose the top surface of the lower interlayer insulating layer 150. In addition, the planarization process may be performed to expose the top surfaces of the gate spacers SP. The preliminary gate dielectric pattern PGD may extend along a bottom surface of the preliminary gate electrode PGE and may be provided on both sidewalls of the preliminary gate electrode PGE (i.e., between the preliminary gate electrode PGE and the gate spacers SP).

Referring back to FIG. 2, an upper portion of the preliminary gate electrode PGE may be recessed to form the gate electrode GE. For example, the recess of the preliminary gate electrode PGE may be performed by an etching process that is configured to selectively etch the preliminary gate electrode PGE. In example embodiments, the etching process may be performed until the gate electrode GE has a top surface lower than that of the lower interlayer insulating layer 150. In other words, the top surface of the gate electrode GE may be lower than that of the lower interlayer insulating layer 150. Thereafter, the gate dielectric pattern GD may be formed by removing a portion of the preliminary gate dielectric pattern PGD positioned above the gate electrode GE.

Next, the gate capping pattern GP may be formed on the gate electrode GE. For example, a gate capping layer may be formed to fill the gap regions 160 provided with the gate dielectric pattern GD. Thereafter, the gate capping layer may be planarized to form the gate capping pattern GP. The planarization of the gate capping layer (e.g., using a CMP process) may be performed to expose the lower interlayer insulating layer 150. The gate capping layer may be formed of or include, for example, a silicon nitride layer or a silicon oxynitride layer. The gate capping layer may be formed by a CVD process. A portion of the active fin AF positioned below the gate electrode GE may serve as the channel regions CH. When viewed in a plan view, the channel regions CH may be interposed between the source/drain regions SD. The gate dielectric pattern GD, the gate electrode GE, and the gate capping pattern GP may serve as the gate structure GS. The gate structure GS may extend in the second direction D2.

In example embodiments, an upper interlayer insulating layer (not shown) may be formed on the lower interlayer insulating layer 150. The upper interlayer insulating layer may be formed to cover the top surfaces of the gate structures GS. The upper interlayer insulating layer may be formed of or include at least one of, for example, oxides, nitrides, or oxynitrides. First contact holes (not shown) may be formed to penetrate the upper interlayer insulating layer and the lower interlayer insulating layer 150 and expose the source/drain regions SD. Upper portions of the source/drain regions SD may be partially removed by an etching process for forming the first contact holes. A second contact hole (not shown) may be formed to penetrate the upper interlayer insulating layer and the lower interlayer insulating layer 150 and expose the gate electrode GE. Thereafter, first and second contact plugs may be formed to fill the first and second contact holes, respectively. Interconnection lines may be formed on the upper interlayer insulating layer to be coupled to the first and second contact plugs. The interconnection lines may be configured to make it possible to apply voltages to the source/drain regions SD and the gate electrode GE through the first and second contact plugs. The first and second contact plugs and the interconnection lines may be formed of or include at least one of conductive materials.

According to example embodiments of the inventive concepts, a liner layer may be formed to cover an upper portion of an active pattern, and thus, it is possible to prevent or inhibit the active pattern from being exposed and damaged in a process of forming a sacrificial gate pattern. In addition, a capping insulating pattern, which are used as an etch mask in a process of forming a gap region, may be formed of a material having an etch selectivity with respect to the liner layer. Accordingly, when the sacrificial gate pattern and the liner layer are etched to form the gap region, it is possible to reduce a removal of the capping insulating pattern. This makes it possible to prevent or inhibit the lower interlayer insulating layer from being lost and thereby to increase a process margin in the process of forming a gate electrode. As a result, it is possible to fabricate a semiconductor device with improved electric characteristics and to increase a process margin in a process of fabricating such a semiconductor device (e.g., in the process of forming the gate electrode).

Although not shown, the fabrication processes described with reference to FIGS. 12 through 17 may be performed on the structure of FIG. 11 to form the semiconductor device of FIG. 3.

Figure 18:
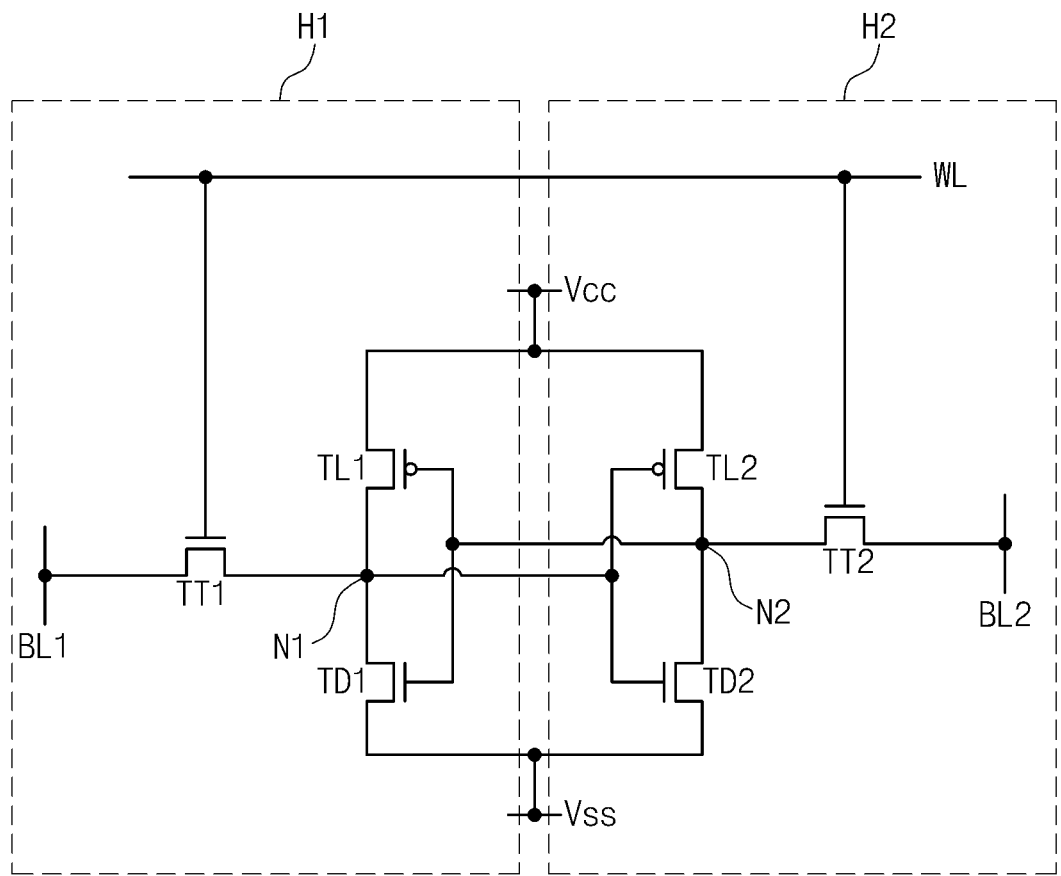
FIG. 18 is an equivalent circuit diagram illustrating a CMOS SRAM cell including a semiconductor device according to example embodiments of the inventive concepts.

FIG. 18 is an equivalent circuit diagram illustrating a CMOS SRAM cell including a semiconductor device according to example embodiments of the inventive concepts. Referring to FIG. 18, the CMOS SRAM cell may include a pair of driver transistors TD1 and TD2, a pair of transfer transistors TT1 and TT2, and a pair of load transistors TL1 and TL2. The driver transistors TD1 and TD2 may be pull-down transistors, the transfer transistors TT1 and TT2 may be pass transistors, and the load transistors TL1 and TL2 may be pull-up transistors. The driver transistors TD1 and TD2 and the transfer transistors TT1 and TT2 may be NMOS transistors, and the load transistors TL1 and TL2 may be PMOS transistors. At least one of the driver, transfer, and load transistors TD1, TD2, TT1, TT2, TL1, and TL2 may be provided in the form of the field effect transistor according to example embodiments of the inventive concepts.

The first driver transistor TD1 and the first transfer transistor TT1 may be connected in series to each other. A source region of the first driver transistor TD1 may be electrically connected to a ground line Vss, and a drain region of the first transfer transistor TT1 may be electrically connected to a first bit line BL1. The second driver transistor TD2 and the second transfer transistor TT2 may be connected in series to each other. A source region of the second driver transistor TD2 may be electrically connected to the ground line Vss, and a drain region of the second transfer transistor TT2 may be electrically connected to a second bit line BL2.

Source and drain regions of the first load transistor TL1 may be electrically connected to a power line Vcc and a drain region of the first driver transistor TD1, respectively. Source and drain regions of the second load transistor TL2 may be electrically connected to the power line Vcc and a drain region of the second driver transistor TD2, respectively. The drain region of the first load transistor TL1, the drain region of the first driver transistor TD1, and a source region of the first transfer transistor TT1 may serve as a first node N1. The drain region of the second load transistor TL2, the drain region of the second driver transistor TD2, and a source region of the second transfer transistor TT2 may serve as a second node N2. Gate electrodes of the first driver transistor TD1 and the first load transistor TL1 may be electrically connected to the second node N2, and gate electrodes of the second driver transistor TD2 and the second load transistor TL2 may be electrically connected to the first node N1. Gate electrodes of the first and second transfer transistors TT1 and TT2 may be electrically connected to a word line WL. The first driver transistor TD1, the first transfer transistor TT1, and the first load transistor TL1 may constitute a first half cell H1, while the second driver transistor TD2, the second transfer transistor TT2, and the second load transistor TL2 may constitute a second half cell H2.

Figure 19:
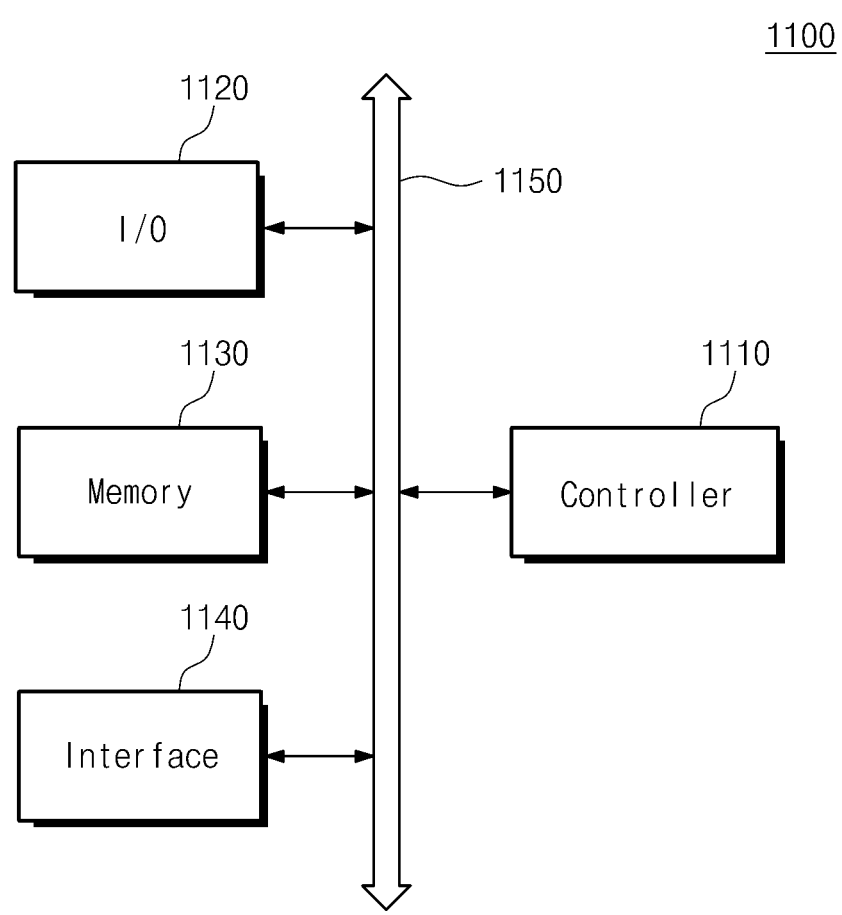
FIG. 19 is a block diagram illustrating an example of an electronic system including a semiconductor device according to example embodiments of the inventive concepts.

FIG. 19 is a block diagram illustrating an example of an electronic system including a semiconductor device according to example embodiments of the inventive concepts.

Referring to FIG. 19, an electronic system 1100 according to example embodiments of the inventive concepts may include a controller 1110, an input-output (I/O) unit 1120, a memory device 1130, an interface 1140, and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or another logic device, which is configured to have a similar function to them. The I/O unit 1120 may include a keypad, a keyboard, or a display unit. The memory device 1130 may store data and/or commands. The interface unit 1140 may transmit electrical data to a communication network or may receive electrical data from a communication network. The interface unit 1140 may operate in a wireless or wired manner. For example, the interface unit 1140 may include an antenna for the wireless communication or a transceiver for the wired and/or wireless communication. Although not shown in the drawings, the electronic system 1100 may further include a fast DRAM device and/or a fast SRAM device that acts as a cache memory for improving an operation of the controller 1110. A semiconductor device according to example embodiments of the inventive concepts may be provided as a part of the memory device 1130, the controller 1110, or the I/O unit 1120.

The electronic system 1100 may be applied to, for example, a personal digital assistant (PDA), a portable computer, a web tablet, a wireless phone, a mobile phone, a digital music player, a memory card, or other electronic products configured to receive or transmit information data by wireless.

Figure 20:
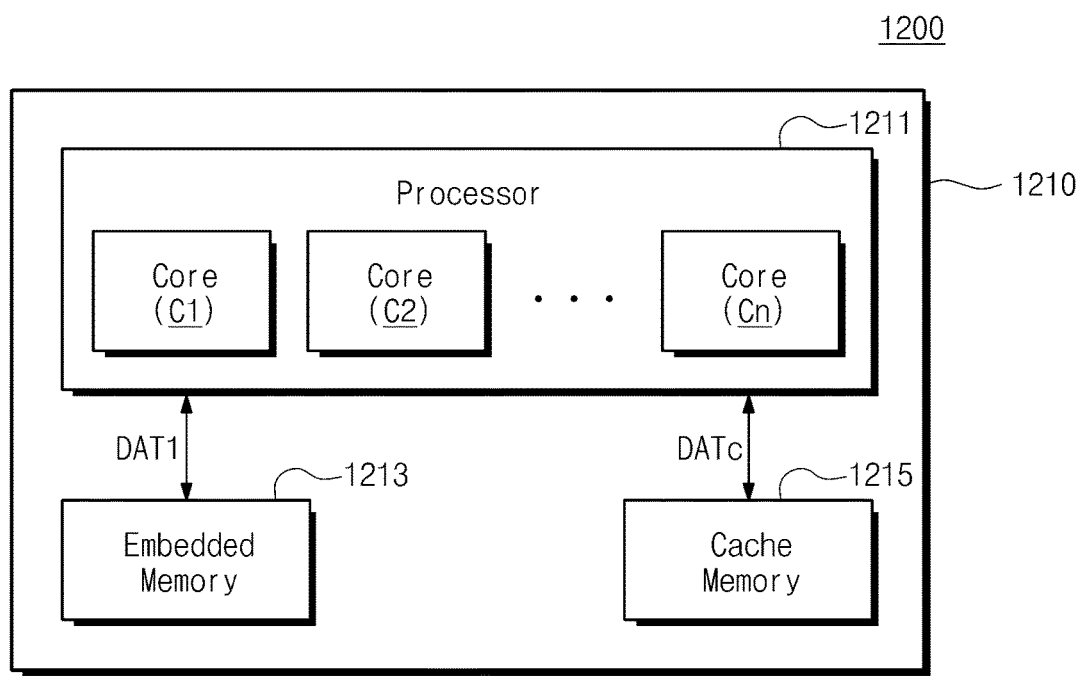
FIG. 20 is a block diagram illustrating an example of an electronic device including a semiconductor device according to example embodiments of the inventive concepts.

FIG. 20 is a block diagram illustrating an example of an electronic device including a semiconductor device according to example embodiments of the inventive concepts.

Referring to FIG. 20, an electronic device 1200 may include a semiconductor chip 1210. The semiconductor chip 1210 may include a processor 1211, an embedded memory 1213, and a cache memory 1215.

The processor 1211 may include one or more processor cores C1-Cn. The one or more processor cores C1-Cn may be configured to process data and signals. The processor cores C1-Cn may be configured to include the semiconductor device according to example embodiments of the inventive concepts.

The electronic device 1200 may be configured to perform its own functions using the processed data and signals. As an example, the processor 1211 may be an application processor.

The embedded memory 1213 may exchange a first data DAT1 with the processor 1211. The first data DAT1 may be data processed, or to be processed, by the one or more processor cores C1-Cn. The embedded memory 1213 may manage the first data DAT1. For example, the embedded memory 1213 may be used for a buffering operation on first data DAT1. In other words, the embedded memory 1213 may be operated as a buffer memory or a working memory for the processor 1211.

In example embodiments, the electronic device 1200 may be used to realize a wearable electronic device. In general, the wearable electronic device may be configured to perform an operation of calculating a relatively small amount of data, rather than calculating a relatively large amount of data. In this sense, in the case where the electronic device 1200 is used for a wearable electronic device, the embedded memory 1213 may be configured to have a relatively small buffer capacity.

The embedded memory 1213 may be a static random access memory (SRAM) device. The SRAM device may have a faster operating speed than that of a dynamic random access memory (DRAM) device. Accordingly, in the case where the SRAM is embedded in the semiconductor chip 1210, it is possible for the electronic device 1200 to have a small size and a fast operating speed. Furthermore, in the case where the SRAM is embedded in the semiconductor chip 1210, it is possible to reduce an active power of the electronic device 1200. As an example, the SRAM may include at least one of the semiconductor devices according to example embodiments of the inventive concepts.

The cache memory 1215 may be mounted on the semiconductor chip 1210, along with the one or more processor cores C1-Cn. The cache memory 1215 may be configured to store cache data DATc that will be used or directly accessed by the one or more processor cores C1-Cn. The cache memory 1215 may be configured to have a relatively small capacity and a very fast operating speed. In example embodiments, the cache memory 1215 may include an SRAM device including the semiconductor device according to example embodiments of the inventive concepts. The cache memory 1215 may include a static random access memory (SRAM) including a semiconductor device according to example embodiments of the inventive concepts. In the case where the cache memory 1215 is used, it is possible to reduce an access frequency or an access time to the embedded memory 1213 performed by the processor 1211. In other words, the use of the cache memory 1215 may allow the electronic device 1200 to have a relatively fast operating speed.

To provide better understanding of example embodiments of the inventive concepts, the cache memory 1215 is illustrated in FIG. 20 to be a component separated from the processor 1211. However, the cache memory 1215 may be included in the processor 1211. In addition, example embodiments of the inventive concepts are not limited to the example illustrated by FIG. 20.

The processor 1211, the embedded memory 1213, and the cache memory 1215 may be configured to exchange or transmit data, based on at least one of various interface protocols. For example, the processor 1211, the embedded memory 1213, and the cache memory 1215 may be configured to exchange or transmit data, based on at least one of Universal Serial Bus (USB), Small Computer System Interface (SCSI), Peripheral Component Interconnect (PCI) Express, Advanced Technology Attachment (ATA), Parallel ATA (PATA), Serial ATA (SATA), Serial Attached SCSI (SAS), Integrated Drive Electronics (IDE), or Universal Flash Storage (UFS).

Figure 21:
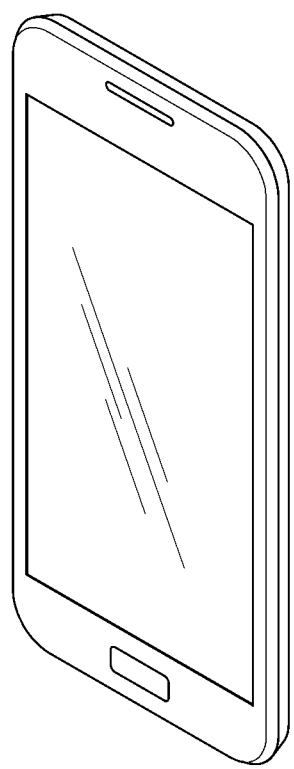
FIG. 21 is a perspective view of a mobile phone, which is illustrated as an example of an electronic system according to example embodiments of the inventive concepts.

FIG. 21 is a schematic view illustrating an example of various electronic devices, to which the electronic system 1100 of FIG. 19 can be applied. As shown in FIG. 21, the electronic system 1100 of FIG. 19 can be applied to realize a mobile phone 2000. However, it will be understood that, in other example embodiments, the electronic system 1100 of FIG. 19 may be applied to portable notebook computers, MP3 players, navigators, solid state disks (SSDs), automobiles, and/or household appliances.

According to example embodiments of the inventive concepts, a liner layer may be formed to cover an upper portion of an active pattern, and thus, it is possible to prevent or inhibit the active pattern from being exposed and damaged in a process of forming a sacrificial gate pattern.

In addition, a capping insulating pattern, which are used as an etch mask in a process of forming a gap region, may be formed of a material having an etch selectivity with respect to the liner layer. Accordingly, when the sacrificial gate pattern and the liner layer are etched to form the gap region, it is possible to reduce a removal of the capping insulating pattern. This makes it possible to prevent or inhibit the lower interlayer insulating layer from being lost and thereby to increase a process margin in the process of forming a gate electrode. As a result, it is possible to fabricate a semiconductor device with improved electric characteristics and to increase a process margin in a process of fabricating such a semiconductor device (e.g., in the process of forming the gate electrode).

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, the method comprising:
    forming an active fin Field Effect Transistor (finFET) pattern protruding from a substrate, the active finFET pattern including a material having a lattice constant greater than a lattice constant of the substrate;
    forming a liner layer on the active finFET pattern;
    forming a sacrificial gate pattern on the liner layer and crossing the active finFET pattern;
    forming source/drain regions on the active finFET pattern and at both sides of the sacrificial gate pattern;
    forming an interlayer insulating layer covering the source/drain regions, the interlayer insulating layer having a top surface lower than a top surface of the sacrificial gate pattern;
    forming capping insulating patterns on the interlayer insulating layer to expose the sacrificial gate pattern, the capping insulating patterns including a material having an etch selectivity with respect to the liner layer; and
    removing the sacrificial gate pattern and the liner layer by an etching process using the capping insulating patterns as an etch mask to form a gap region exposing the active finFET pattern.

2. The method of claim 1, wherein the forming capping insulating patterns comprises:
    forming at least one capping insulating layer to cover the top surfaces of the interlayer insulating layer and the sacrificial gate pattern; and
    patterning the capping insulating layer to expose the sacrificial gate pattern.

3. The method of claim 2, wherein the patterning the capping insulating layer comprises:
    forming protection insulating patterns on the capping insulating layer to expose a portion of the capping insulating layer, the protection insulating patterns including a material having an etch selectivity with respect to the capping insulating layer; and removing the portion of the capping insulating layer exposed by the protection insulating patterns by an etch-back process, the portion of the capping insulating layer overlapping the sacrificial gate pattern in a plan view.

4. The method of claim 2, wherein the forming at least one capping insulating layer comprises:
sequentially forming a first capping insulating layer and a second capping insulating layer, at least one of the first and second capping insulating layers including a material having an etch selectivity with respect to the liner layer.

5. The method of claim 4, wherein the sequentially forming forms:
one of the first and second capping insulating layers including a same material as the liner layer; and
the other of the first and second capping insulating layers including a material having an etch selectivity with respect to the liner layer.

6. The method of claim 2, wherein:
the liner layer includes at least one of silicon nitride (SiN), silicon carbonitride (SiCN), silicon boron nitride (SiBN), and silicon carbon boron nitride (SiCBN); and
the capping insulating layer includes silicon oxycarbonitride (SiOCN).

7. The method of claim 1, wherein the active finFET pattern includes a first region below the sacrificial gate pattern and second regions at both sides of the sacrificial gate pattern, and
wherein the forming source/drain regions comprises,
partially recessing the second regions to form recess regions in the active finFET pattern, and
performing a selective epitaxial process using the active finFET pattern exposed by the recess regions as a seed layer to form the source/drain regions.

8. The method of claim 7, further comprising:
performing one of a thermal treatment process and a plasma treatment process on the active finFET pattern exposed by the recess regions after the partially recessing the second regions.

9. The method of claim 1, wherein the active finFET pattern comprises a first region below the sacrificial gate pattern and second regions at both sides of the sacrificial gate pattern, a top surface of the first region being coplanar with a top surface of the second regions, and
wherein the forming of the source/drain regions comprises,
performing a selective epitaxial process using the second regions as a seed layer to form a cladding layer covering the top surface and upper side surfaces of each of the second regions.

10. The method of claim 9, further comprising:
performing one of a thermal treatment process and a plasma treatment process on the second regions to form a barrier layer between the second regions and the cladding layer.

11. The method of claim 10, wherein a material of the barrier layer includes a same element as the material of the active finFET pattern.

12. The method of claim 9, wherein the cladding layer comprises:
a first sidewall inclined at a negative angle with respect to a top surface of the substrate, the first sidewall having a first end portion;
a second sidewall inclined at a positive angle with respect to the top surface of the substrate, the second sidewall having a second end portion; and
a third sidewall having third and fourth end portions adjacent to the substrate, the third end portion being connected to the first end portion, and the fourth end portion being connected to the second end portion.

13. A method of fabricating a semiconductor device, the method comprising:
forming an active fin Field Effect Transistor (finFET) pattern protruding between device isolation patterns on a substrate, the active finFET pattern including a material having a lattice constant greater than a lattice constant of the substrate;
forming a liner layer to cover top and side surfaces of the active finFET pattern;
forming a sacrificial gate pattern on the liner layer to cross the active finFET pattern;
forming source/drain regions on the active finFET pattern and at both sides of the sacrificial gate pattern;
forming an interlayer insulating layer to cover the source/drain regions, the interlayer insulating layer having a top surface lower than a top surface of the sacrificial gate pattern;
forming capping insulating patterns on the interlayer insulating layer to expose the sacrificial gate pattern, the capping insulating patterns including a material having an etch selectivity with respect to the liner layer; and
replacing the sacrificial gate pattern with a gate electrode.

14. The method of claim 13, wherein:
the active finFET pattern includes a first region below the sacrificial gate pattern and second regions at both sides of the sacrificial gate pattern;
the liner layer is formed to cover the first and second regions; and
the forming source/drain regions comprises,
removing the liner layer from the second regions, and
forming an epitaxial layer on the second regions.

15. The method of claim 13, wherein the forming capping insulating patterns comprises:
forming at least one capping insulating layer to cover the top surfaces of the interlayer insulating layer and the sacrificial gate pattern;
forming protection insulating patterns on the capping insulating layer to expose a portion of the capping insulating layer, the protection insulating patterns including a material having an etch selectivity with respect to the capping insulating layer; and
removing the portion of the capping insulating layer exposed by the protection insulating patterns by an etch-back process, the portion of the capping insulating layer overlapping the sacrificial gate pattern in a plan view.

16. The method of claim 15, wherein the forming at least one capping insulating layer comprises:
sequentially forming a first capping insulating layer and a second capping insulating layer, at least one of the first and second capping insulating layers including a material having an etch selectivity with respect to the liner layer.

17. The method of claim 13, wherein the replacing the sacrificial gate pattern comprises:
removing the sacrificial gate pattern and the liner layer using the capping insulating patterns as an etch mask to form a gap region exposing the active finFET pattern;
forming a preliminary gate electrode to fill the gap region; and
recessing the preliminary gate electrode to form the gate electrode.

18. A method comprising:
forming an active fin Field Effect Transistor (finFET) pattern protruding from a substrate;
forming a liner layer on an upper portion of the active finFET pattern;
forming a sacrificial gate pattern on the liner layer and crossing the active finFET pattern;
forming at least one capping insulating layer on a top surface of the sacrificial gate pattern;
patterning the capping insulating layer to form capping insulating patterns exposing the sacrificial gate pattern, the capping insulating patterns including a nitride-based material having an etch selectivity with respect to the liner layer; and
removing the sacrificial gate pattern and the liner layer using the capping insulating patterns as an etch mask to form a gap region exposing the active finFET pattern.

19. The method of claim 18, wherein the forming at least one capping insulating layer comprises:
sequentially forming a first capping insulating layer and a second capping insulating layer, the first capping insulating layer including a same material as the liner layer, and the second capping insulating layer including a material having an etch selectivity with respect to the liner layer.

20. The method of claim 18, wherein:
the liner layer includes at least one of silicon nitride (SiN), silicon carbonitride (SiCN), silicon boron nitride (SiBN), and silicon carbon boron nitride (SiCBN); and
the capping insulating layer includes silicon oxycarbonitride (SiOCN).

* * * * *